(12) United States Patent
Kim et al.

(10) Patent No.: US 11,521,955 B2
(45) Date of Patent: Dec. 6, 2022

(54) DISPLAY APPARATUS

(71) Applicant: SAMSUNG ELECTRONICS CO., LTD., Suwon-si (KR)

(72) Inventors: Sung Yeol Kim, Suwon-si (KR); Dae Sik Kim, Suwon-si (KR); Seung Yong Shin, Suwon-si (KR); Jong Hoon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 148 days.

(21) Appl. No.: 16/955,505

(22) PCT Filed: Dec. 14, 2018

(86) PCT No.: PCT/KR2018/015915
§ 371 (c)(1),
(2) Date: Jun. 18, 2020

(87) PCT Pub. No.: WO2019/124883
PCT Pub. Date: Jun. 27, 2019

(65) Prior Publication Data
US 2020/0321322 A1    Oct. 8, 2020

(30) Foreign Application Priority Data

Dec. 18, 2017 (KR) .................. 10-2017-0174156

(51) Int. Cl.
*H01L 25/075* (2006.01)
*H01L 25/16* (2006.01)
*H01L 33/50* (2010.01)

(52) U.S. Cl.
CPC ........ *H01L 25/0753* (2013.01); *H01L 25/167* (2013.01); *H01L 33/50* (2013.01)

(58) Field of Classification Search
CPC ...................................................... H01L 33/50
See application file for complete search history.

(56) References Cited

U.S. PATENT DOCUMENTS

2003/0085854 A1  5/2003  Tsuji
2014/0231753 A1* 8/2014  Chen ..................... H01L 27/322
                                                            257/40

(Continued)

FOREIGN PATENT DOCUMENTS

EP         3236502 A1   10/2017
KR  10-2001-0029903 A    4/2001

(Continued)

OTHER PUBLICATIONS

International Search Report (PCT/ISA/210) dated Apr. 15, 2019, issued by International Searching Authority in International Application No. PCT/KR2018/015915, on.

(Continued)

*Primary Examiner* — Jay C Chang
*Assistant Examiner* — Mikka Liu
(74) *Attorney, Agent, or Firm* — Sughrue Mion, PLLC

(57) ABSTRACT

A display apparatus includes a blue light emitting element configured to emit blue light; a red light emitting element configured to emit red light; and a green light emitting element configured to emit green light. The blue light emitting element may include a first light emitting diode configured to emit light having a maximum intensity at a wavelength shorter than a blue wavelength; and a blue filter configured to transmit light having the blue wavelength.

15 Claims, 25 Drawing Sheets

(56) References Cited

U.S. PATENT DOCUMENTS

| | | | |
|---|---|---|---|
| 2015/0261076 A1* | 9/2015 | Dijken | F21V 9/32 |
| | | | 977/774 |
| 2017/0229429 A1 | 8/2017 | He et al. | |
| 2017/0287887 A1 | 10/2017 | Takeya et al. | |
| 2017/0358624 A1* | 12/2017 | Takeya | H01L 25/167 |

FOREIGN PATENT DOCUMENTS

| | | |
|---|---|---|
| KR | 10-2010-0089606 A | 8/2010 |
| WO | 2017007770 A2 | 1/2017 |

OTHER PUBLICATIONS

Written Opinion (PCT/ISA/237) dated Apr. 15, 2019, issued by the International Searching Authority in International Application No. PCT/KR2018/015915.

Communication dated Sep. 9, 2020 issued by the European Patent Office in European Application No. 18893087.9.

Xu, S., et al., "Rapid Synthesis of High-Quality InP Nanocrystals", Journal of American Chemical Society, Feb. 1, 2006, vol. 128, pp. 1054-1055.

Communication dated Jan. 24, 2022, issued by the European Patent Office in European Application No. 18893087.9.

Communication dated Jul. 27, 2022 issued by the Korean Intellectual Property Office in Korean Application No. 10-2017-0174156.

\* cited by examiner (a)

(b)

DISPLAY APPARATUS

TECHNICAL FIELD

The present disclosure relates to a display apparatus, and more particularly, to a display apparatus including a light emitting diode.

BACKGROUND ART

In the related art, display apparatuses refer to output apparatuses displaying visual information converted from received or stored image information to users and have been widely used in various application fields such as individual homes or places of business.

For example, the display apparatuses may be monitor devices connected to personal computers or server computers, portable computer devices, navigation devices, televisions (TVs), Internet Protocol televisions (IPTVs), portable terminals, such as smartphones, tablet personal computers (PCs), personal digital assistants (PDAs), or cellular phones, or various display apparatuses used to play advertisements or movies in the industrial field, or various types of audio/video systems.

The display apparatuses may display an image using various types of display panels. For example, the display apparatuses may include a light emitting diode (LED) panel, an organic light emitting diode (OLED) panel, a liquid crystal display (LCD) panel, and the like.

Among various display panels, a micro LED panel using the light emitting diodes having a size of 100 um (micrometer)*100 um or less have been recently developed.

DISCLOSURE

Technical Problem

An aspect of the present disclosure is to provide a display apparatus including a plurality of micro LEDs.

Another aspect of the present disclosure is to minimize a wavelength deviation of light emitted from a plurality of pixels included in a display apparatus.

Another aspect of the present disclosure is to minimize a wavelength deviation of light emitted from a plurality of micro LEDs included in the display apparatus.

Technical Solution

An aspect of the disclosure provides a display apparatus including: a blue light emitting element configured to emit blue light; a red light emitting element configured to emit red light; and a green light emitting element configured to emit green light. The blue light emitting element may include a first light emitting diode configured to emit light having a maximum intensity at a wavelength shorter than a blue wavelength; and a blue filter configured to transmit light having the blue wavelength.

The first light emitting diode may be configured to emit light having the maximum intensity at any one of 15 nm (nanometer) to 25 nm smaller wavelength than the blue wavelength.

The first light emitting diode may be configured to emit light having the maximum intensity at any one of 440 nm to 450 nm. The blue filter may be configured to block light having a wavelength shorter than 465 nm.

The first light emitting diode may be configured to emit light having the maximum intensity at any one of 440 nm to 450 nm. Light transmittance of the blue filter may be configured to decrease rapidly at 465 nm.

The first light emitting diode may be configured to emit light having the maximum intensity at any one of 440 nm to 450 nm. A blocking characteristic curve of the blue filter may be configured to cross a spectral curve of the first light emitting diode at 465 nm.

The blue light emitting element may further include a transparent resin layer disposed between the first light emitting diode and the blue filter, configured to transmit light emitted from the first light emitting diode.

The blue light emitting element may further include a yellow quantum dot material layer disposed between the first light emitting diode and the blue filter, configured to absorb light emitted from the first light emitting diode and emit light having a wavelength shorter than the blue wavelength, light having a red wavelength, and light having a green wavelength.

The display apparatus may further include a driving circuit configured to supply a driving current to the blue light emitting element; and a compensation circuit configured to compensate a luminance of the light emitted from the blue light emitting element.

The compensation circuit may be configured to control the driving current so that light of a predetermined luminance is emitted from the blue light emitting element.

The red light emitting element may include a second light emitting diode configured to emit light having the maximum intensity at the wavelength shorter than the blue wavelength; and a red quantum dot material layer configured to absorb light emitted from the second light emitting diode and emit light having a red wavelength.

The red light emitting element may include a second light emitting diode configured to emit light having the maximum intensity at the wavelength shorter than the blue wavelength; a yellow quantum dot material layer configured to absorb light emitted from the second light emitting diode and emit light having the wavelength shorter than the blue wavelength, light having a red wavelength, and light having a green wavelength; and a red filter configured to pass light having the red wavelength.

The red light emitting element may include a second light emitting diode configured to emit light having the maximum intensity at a wavelength shorter than a red wavelength; and a red filter configured to block light having the wavelength shorter than the red wavelength.

The green light emitting element may include a third light emitting diode configured to emit light having the maximum intensity at the wavelength shorter than the blue wavelength; and a green quantum dot material layer configured to absorb light emitted from the third light emitting diode and emit light having a green wavelength.

The green light emitting element may include a third light emitting diode configured to emit light having the maximum intensity at the wavelength shorter than the blue wavelength; a yellow quantum dot material layer configured to absorb light emitted from the third light emitting diode and emit light having the wavelength shorter than the blue wavelength, light having a red wavelength, and light having a green wavelength; and a green filter configured to pass light having the green wavelength.

The green light emitting element may include a second light emitting diode configured to emit light having the maximum intensity at a wavelength shorter than a green wavelength; and a green filter configured to block light having the wavelength shorter than the green wavelength.

Another aspect of the disclosure provides a display apparatus including: a first light emitting element configured to emit light having a first wavelength; a second light emitting element configured to emit light having a second wavelength; and a third light emitting element configured to emit light having a third wavelength. The first light emitting element may include a first light emitting diode configured to emit light having a maximum intensity at a wavelength shorter than the first wavelength; and a first optical filter configured to transmit light having the first wavelength.

The first light emitting light emitting diode may be configured to emit light having the maximum intensity at any one of 440 nm to 450 nm. The first optical filter may be configured to block light having a wavelength shorter than 465 nm.

The first light emitting element may further include a first quantum dot material layer configured to absorb light emitted from the first light emitting diode and emit light having the wavelength shorter than the first wavelength, light having the second wavelength, and light having the third wavelength.

The second light emitting element may include a second light emitting diode configured to emit light having the maximum intensity at the wavelength shorter than the first wavelength; a second quantum dot material layer configured to absorb light emitted from the second light emitting diode and emit light having the wavelength shorter than the first wavelength and light having the second wavelength; and a second optical filter configured to block light having the wavelength shorter than the first wavelength and pass light having the second wavelength. In addition, the third light emitting element may include a third light emitting diode configured to emit light having the maximum intensity at the wavelength shorter than the first wavelength; a third quantum dot material layer configured to absorb light emitted from the third light emitting diode and emit light having the wavelength shorter than the first wavelength and light having the third wavelength; and a third optical filter configured to block light having the wavelength shorter than the first wavelength and pass light having the third wavelength.

The second light emitting element may include a second light emitting diode configured to emit light having the maximum intensity at the wavelength shorter than the first wavelength; a second quantum dot material layer configured to absorb light emitted from the second light emitting diode and emit light having the wavelength shorter than the first wavelength, light having the second wavelength, and light having the third wavelength; and a second optical filter configured to block light having the wavelength shorter than the first wavelength and light having the third wavelength and pass light having the second wavelength. In addition, the third light emitting element may include a third light emitting diode configured to emit light having the maximum intensity at the wavelength shorter than the first wavelength; a third quantum dot material layer configured to absorb light emitted from the third light emitting diode and emit light having the wavelength shorter than the first wavelength, light having the second wavelength, and light having the third wavelength; and a third optical filter configured to block light having the wavelength shorter than the first wavelength and light having the second wavelength and pass light having the third wavelength.

Advantageous Effects

According to an aspect of an embodiment, it is possible to provide a display apparatus including a plurality of micro LEDs.

According to another aspect of an embodiment, it is possible to minimize a wavelength deviation of light emitted from a plurality of pixels included in a display apparatus.

According to another aspect of an embodiment, it is possible to minimize a wavelength deviation of light emitted from a plurality of micro LEDs included in a display apparatus.

MODES OF THE INVENTION

Figure 1:
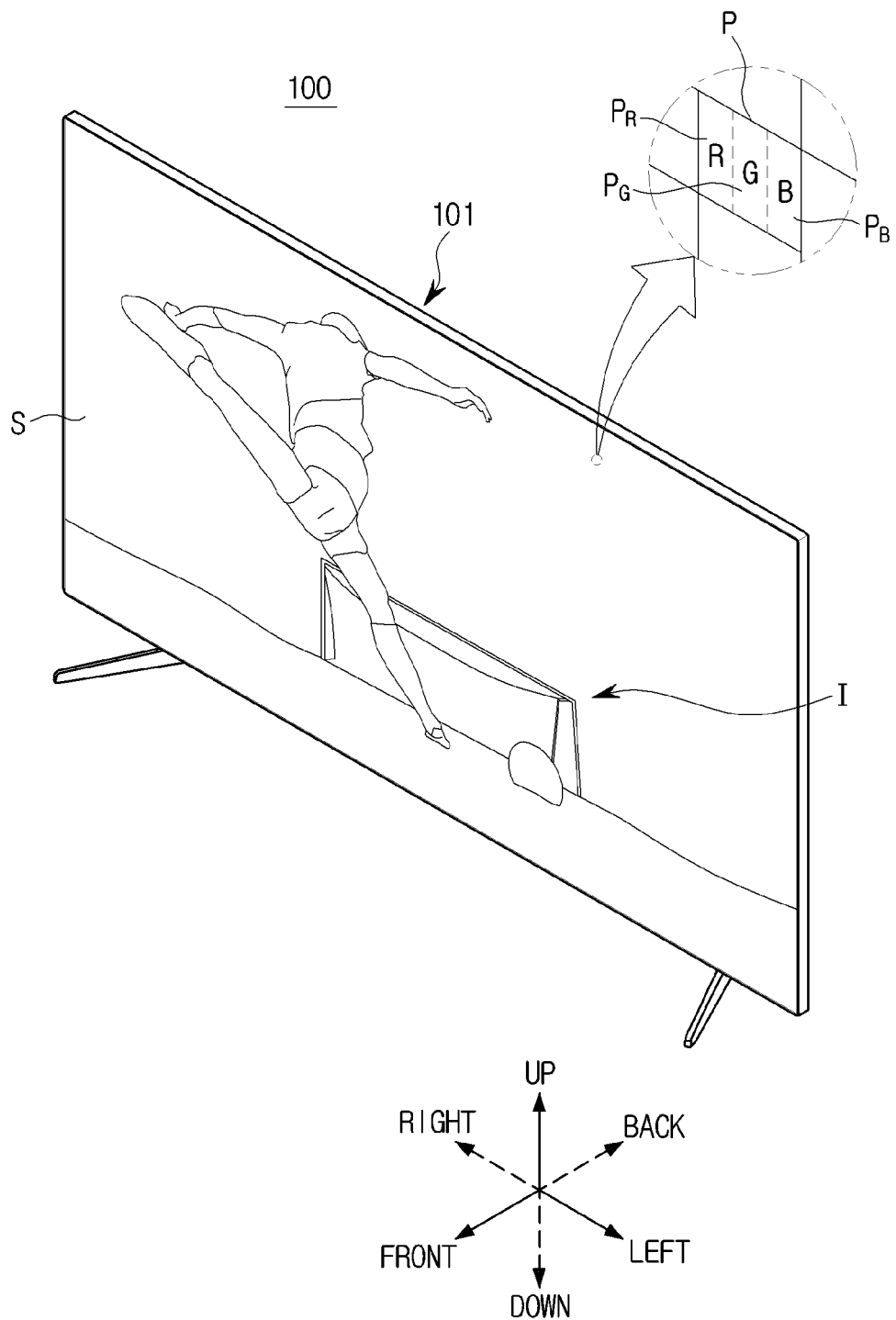
FIG. 1 is a view illustrating an appearance of a display apparatus according to an embodiment.

Like reference numerals refer to like elements throughout the specification. Not all elements of embodiments of the disclosure will be described, and description of what are commonly known in the art or what overlap each other in the embodiments will be omitted. The terms as used throughout the specification, such as "~ part," "~ module," "~ member," "~ block," etc., may be implemented in software and/or hardware, and a plurality of "~ parts," "~ modules," "~ members," or "~ blocks" may be implemented in a single element, or a single "~ part," "~ module," "~ member," or "~ block" may include a plurality of elements.

It will be understood that when an element is referred to as being "connected" to another element, it can be directly or indirectly connected to the other element, wherein the indirect connection includes "connection" via a wireless communication network.

Also, when a part "includes" or "comprises" an element, unless there is a particular description contrary thereto, the part may further include other elements, not excluding the other elements.

Further, when it is stated that a layer is "on" another layer or substrate, the layer may be directly on another layer or substrate or a third layer may be disposed therebetween.

It will be understood that, although the terms first, second, third, etc., may be used herein to describe various elements, it should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step. Each of the steps may be implemented in an order different from the illustrated order unless the context clearly indicates otherwise.

The expression "at least one of A, B and C" should be interpreted to include only A, only B, only C, both A and B, both B and C, both C and A, or all of A, B and C.

Hereinafter, the operation principles and embodiments of the disclosure will be described with reference to the accompanying drawings.

FIG. 1 is a view illustrating an appearance of a display apparatus according to an embodiment.

A display apparatus 100 is an apparatus capable of processing an image signal received from the outside (e.g., external image source) and visually displaying the processed image. As illustrated in FIG. 1, the display apparatus 100 may be implemented as a TV, but the embodiment of the display apparatus 100 is not limited thereto. For example, the display apparatus 100 may be implemented as a monitor of a computer, or may be included in a navigation terminal device or various portable terminal devices. Here, the portable terminal devices may be a desktop computer, a laptop computer, a smartphone, a tablet personal computer (PC), a wearable computing device, or a personal digital assistant (PDA).

In addition, the display apparatus 100 may be a large format display (LFD) installed outdoors such as on a building roof or at a bus stop. The outdoors is not necessarily limited to the outside, but should be understood as a concept including a place where a large number of people can go in and out, even an area such as a subway station, a shopping mall, a movie theater, a company, a store, etc.

The display apparatus 100 may receive a video signal and an audio signal from various content sources, and may output video and audio corresponding to the video signal and the audio signal. For example, the display apparatus 100 may receive television broadcast content through a broadcast receiving antenna or a cable, receive content from a content reproduction device, or receive the content from a content providing server of a content provider.

As illustrated in FIG. 1, the display apparatus 100 may include a main body 101 accommodating a plurality of components for displaying an image I and a screen S provided on one surface of the main body 101 to display the image I.

The main body 101 may form an appearance of the display apparatus 100 and the component for displaying the image I by the display apparatus 100 may be provided in the inside of the main body 101. The main body 101 illustrated in FIG. 1 may be in the form of a flat plate, but the shape of the main body 101 is not limited to that illustrated in FIG. 1. For example, the main body 101 may have a shape in which left and right ends protrude forward and a center part is curved so as to be concave.

The screen S may be formed on the front surface of the main body 101, and the screen S may display the image I as visual information. For example, a still image or a moving image may be displayed on the screen S, and a two-dimensional plane image or a three-dimensional stereoscopic image may be displayed.

A plurality of pixels P may be formed on the screen S, and the image I displayed on the screen S may be formed by a combination of light emitted from the plurality of pixels P. For example, the single image I may be formed on the screen S by combining the light emitted by the plurality of pixels P with a mosaic.

Each of the plurality of pixels P may emit the light of various brightness and various colors.

Each of the plurality of pixels P may include a configuration (for example, an organic light emitting diode) capable of emitting the light directly in order to emit the light of various brightness, or a configuration (for example, a liquid crystal panel) capable of transmitting or blocking the light emitted by a backlight unit or the like.

In order to emit the light of various colors, each of the plurality of pixels P may include subpixels $P_R$, $P_G$, and $P_B$.

The subpixels $P_R$, $P_G$, and $P_B$ may emit light. The red subpixel $P_R$ may emit red light, the green subpixel $P_G$ may emit green light, and the blue subpixel $P_B$ may emit blue light. For example, the red subpixel $P_R$ may emit red light having a wavelength of approximately 620 nm (nanometer, 1 billionth of a meter) to 750 nm, the green subpixel $P_G$ may emit green light having a wavelength of approximately 495 nm to 570 nm, and the blue subpixel $P_B$ may emit blue light having a wavelength of approximately 450 nm to 495 nm.

By the combination of the red light of the red subpixel $P_R$, the green light of the green subpixel $P_G$, and the blue light of the blue subpixel $P_B$, each of the plurality of pixels P may emit the light of various brightness and various colors.

The screen S may be provided in the flat plate shape as illustrated in FIG. 1. However, the shape of the screen S is not limited to that illustrated in FIG. 1. It may be provided in a shape in which both ends protrude forward and the center portion is curved so as to be concave according to the shape of the main body 101.

The display apparatus 100 may include various types of display panels for displaying the image. For example, the display apparatus 100 may include an emissive display panel for displaying the image using an element that is self-luminous. The emissive display panel may include a light emitting diode (LED) panel or an organic light emitting diode (OLED) panel. In addition, the display apparatus 100 may include a non-emissive display panel for displaying the image by passing or blocking light emitted from a light source (backlight unit). The non-emissive display panel may include a liquid crystal display (LCD) panel.

Hereinafter, the display apparatus 100 including the LED panel is described.

Figure 2:
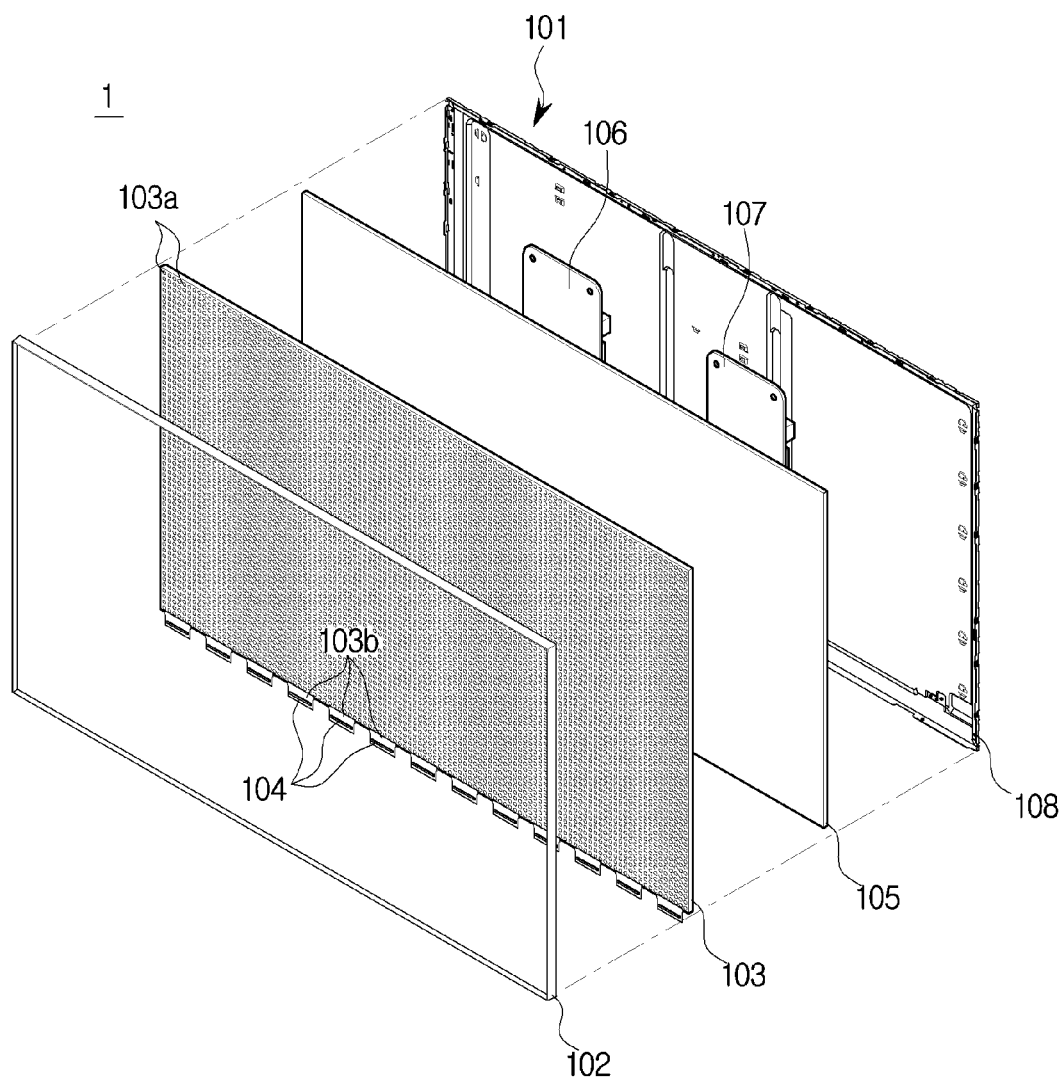
FIG. 2 is an exploded view illustrating a display apparatus according to an embodiment.
Figure 2:
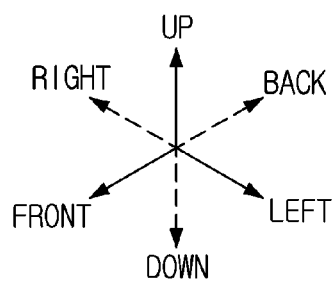

FIG. 2 is an exploded view illustrating a display apparatus according to an embodiment.

As illustrated in FIG. 2, various components for generating the image I on the screen S may be provided in the main body 101.

For example, the main body 101 may include a light emitting diode panel 103 for emitting light forward to generate the image, a control assembly 106 mounted with a configuration for controlling an operation of the light emitting diode panel 103, a power supply assembly 107 mounted with a configuration for supplying power to the light emitting diode panel 103 and the control assembly 106, a bottom chassis 108 for supporting/fixing the control assembly 106 and the power supply assembly 107, and a bezel 102 and a rear cover 70 for preventing the light emitting diode panel 103, the control assembly 106, and the power supply assembly 107 from being exposed to the outside.

The light emitting diode panel 103 may include a plurality of light emitting elements 103a, and the plurality of light emitting elements 103a may each include a light emitting diode. The light emitting diode may represent a semiconductor element that emits light of a predetermined wavelength when power is supplied. The light emitting diode has a polarity like a normal diode, and when a voltage is applied between a cathode and an anode, a current passing through the light emitting diode flows and emits light. The light emitting diode may have various sizes, and the light emitting diode having a size of 100 um (micrometer)*100 um or less may be called a micro light emitting diode. The light emitting diode panel 103 may include, for example, the micro light emitting diode.

Each of the plurality of light emitting elements 103a may emit light of various colors and various brightness. The light emitting diodes included in each of the plurality of light emitting elements 103a may emit light having different wavelengths (different colors) according to a constituent material. For example, the light emitting diode including aluminum gallium arsenide (AlGaAs), gallium arsenide phosphorus (GaAsP), and gallium phosphide (GaP) may emit red light having a wavelength of approximately 620 nm to 750 nm, the light emitting diode indium gallium nitride (InGaN) may emit green light having a wavelength of approximately 495 nm to 570 nm, and the light emitting diode including gallium nitride (GaN) may emit blue light having a wavelength of approximately 450 nm to 495 nm.

In addition, the plurality of light emitting elements 103a may emit light of different intensities according to the magnitude of the supplied current. The light emitting diodes included in each of the plurality of light emitting elements 103a may emit light having a strong intensity as a driving current supplied increases.

The image may be formed by the combination of light emitted from each of the plurality of light emitting elements 103a. For example, the image may be formed by the combination of the red light emitted from the red light emitting diode, the green light emitted from the green light emitting diode, and the blue light emitted from the blue light emitting diode.

The front surface of the light emitting diode panel 103 (surface on which light is emitted) may form the screen S of the display apparatus 100 described above, and each of the plurality of light emitting elements 103a may form the pixels P or the subpixels $P_R$, $P_G$, and $P_B$ described above.

On one side of the light emitting diode panel 103, a cable 103b for transmitting image data to the light emitting diode panel 103, and a display driver integrated circuit (DDI) 104 (hereinafter referred to as 'driver IC') for processing digital image data and outputting an analog image signal may be provided.

The cable 103b may electrically connect between the control assembly 106 and the power assembly 107 described above and the driver IC 104, and may also electrically connect between the driver IC 104 and the light emitting diode panel 103. The cable 103b may include a flexible flat cable or a film cable that can be bent.

The driver IC 104 may receive the image data and the power from the control assembly 106 and the power supply assembly 107 through the cable 103b, and may supply the image signal and a driving current to the light emitting diode panel 103 through the cable 103b.

The cable 103b and the driver IC 104 may be integrally implemented as a film cable, a chip on film (COF), a tape carrier packet (TCP), or the like. In other words, the driver IC 104 may be disposed on the cable 103b. However, the present disclosure is not limited thereto, and the driver IC 104 may be disposed on the light emitting diode panel 103 or the control assembly 106.

The control assembly 106 may include a control circuit that controls the operation of the light emitting diode panel 103. The control circuit may process the image data received from an external content source and transmit the image data to the light emitting diode panel 103 so that the plurality of light emitting elements 103a emit light having different colors and different brightness.

The power assembly 107 may supply the power to the light emitting diode panel 103 so that the plurality of light emitting elements 103a emit light having different colors and different brightness.

The control assembly 106 and the power supply assembly 107 may be implemented with a printed circuit board and various circuits mounted on the printed circuit board. For example, the power supply circuit may include a capacitor, a coil, a resistance element, a microprocessor, and the like, and a power supply circuit board on which they are mounted. Further, the control circuit may include a memory, the microprocessor, and a control circuit board on which they are mounted.

Figure 3:
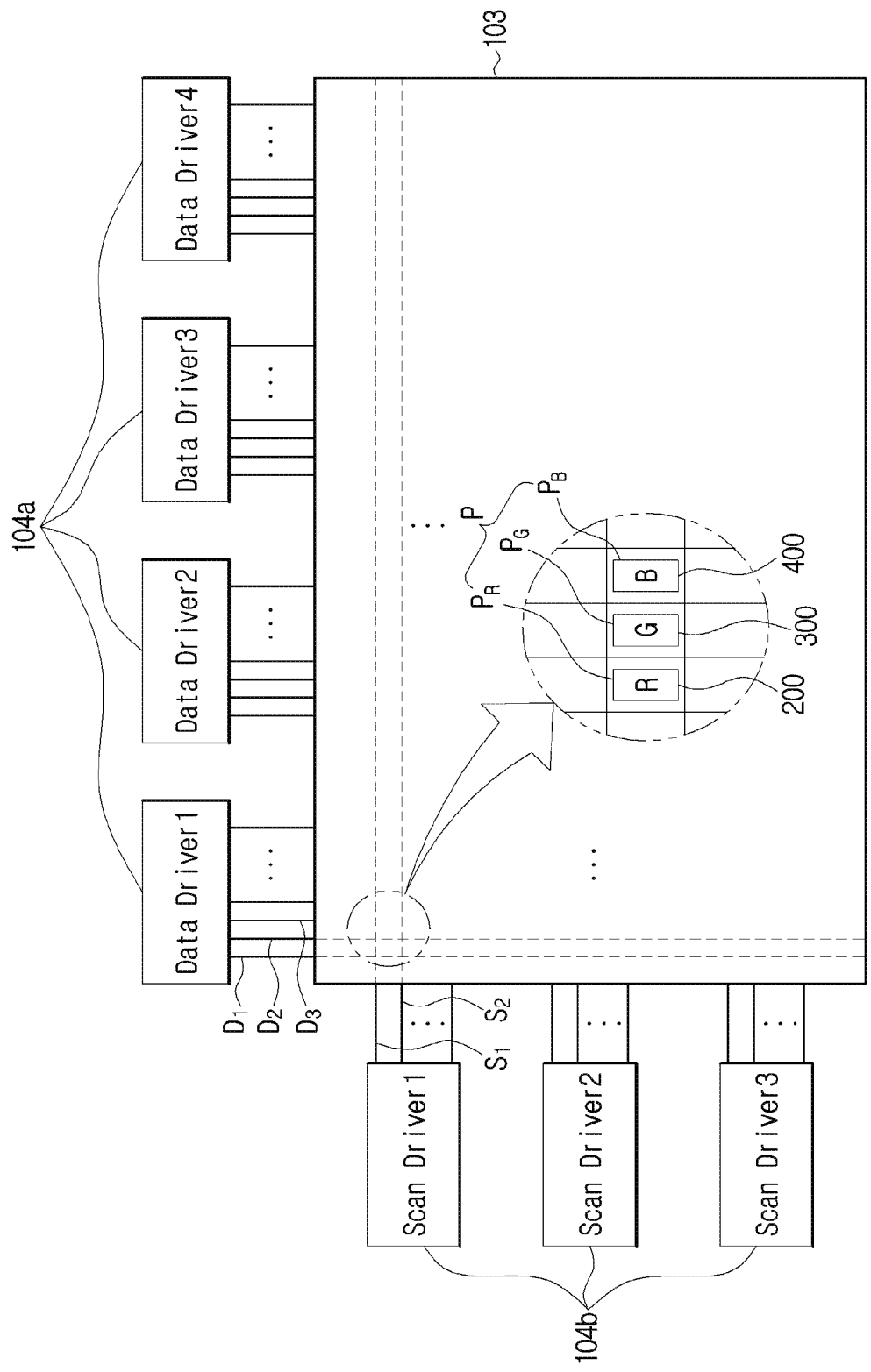
FIG. 3 is a view illustrating a light emitting diode panel and a driver IC included in a display apparatus according to an embodiment.
Figure 4:
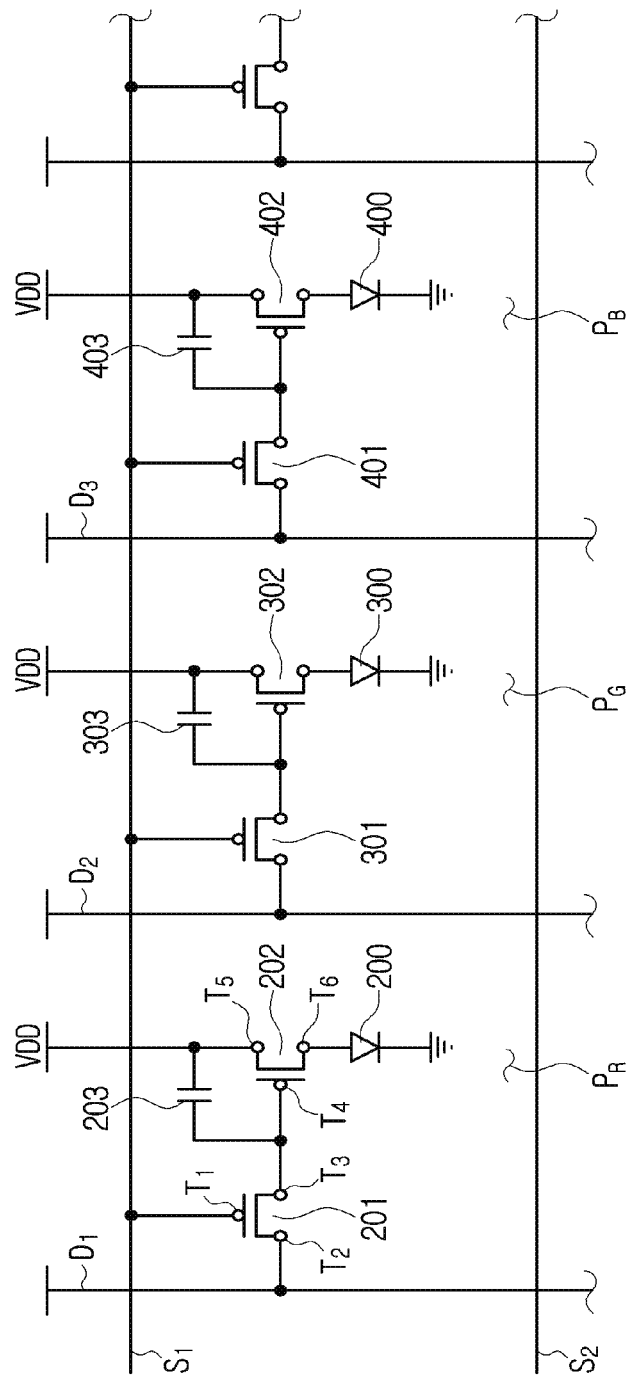
FIG. 4 is a view illustrating an equivalent circuit of a light emitting diode panel included in a display apparatus according to an embodiment.

FIG. 3 is a view illustrating a light emitting diode panel and a driver IC included in a display apparatus according to an embodiment, and FIG. 4 is a view illustrating an equivalent circuit of a light emitting diode panel included in a display apparatus according to an embodiment.

As illustrated in FIGS. 3 and 4, the display apparatus 100 may include a data driver 104a, a scan driver 104b, and the light emitting diode panel 103.

The light emitting diode panel 103 may include the plurality of pixels P, and each of the plurality of pixels P may include the red subpixel $P_R$, the green subpixel $P_G$, and the blue subpixel $P_B$.

The plurality of subpixels $P_R$, $P_G$, and $P_B$ may be arranged in two-dimensions on the light emitting diode panel 103. For example, the plurality of subpixels $P_R$, $P_G$, and $P_B$ may be arranged in a matrix on the light emitting diode panel 103. In other words, the plurality of subpixels $P_R$, $P_G$, and $P_B$ may be arranged in rows and columns.

A plurality of data lines $D_1$, $D_2$ and $D_3$ and a plurality of scan lines $S_1$ and $S_2$ may be provided between the plurality of subpixels $P_R$, $P_G$, and $P_B$. The plurality of scan lines $S_1$ and $S_2$ may be connected to the scan driver 104b, and the plurality of data lines $D_1$, $D_2$ and $D_3$ may be connected to the data driver 104a.

The data driver 104a may receive red/green/blue image data (hereinafter referred to as "RGB image data") and a data control signal from the control circuit of the control assembly 106, and may output the RGB image data to the light emitting diode panel 103 according to the data control signal. Particularly, the data driver 104a may receive digital RGB image data, convert the digital RGB image data to an analog RGB image signal, and output the analog RGB image signal to the light emitting diode panel 103.

Each of a plurality of outputs provided in the data driver 104a may be connected to the plurality of data lines $D_1$, $D_2$, and $D_3$ of the light emitting diode panel 103. The data driver 104a may output the RGB image signal to each of the plurality of subpixels $P_R$, $P_G$, and $P_B$ through the plurality of data lines $D_1$, $D_2$, and $D_3$. For example, the data driver 104a may simultaneously output the RGB image signal to each of the plurality of subpixels $P_R$, $P_G$, and $P_B$ included in one row on the light emitting diode panel 103.

The scan driver 104b may receive a scan control signal from the control circuit of the control assembly 106, and may activate the plurality of subpixels $P_R$, $P_G$, and $P_B$ included in any one of the plurality of rows according to the scan control signal. For example, the scan driver 104b may output an activation signal to any one of the plurality of scan lines $S_1$ and $S_2$ according to the scan control signal.

The scan driver 104b may select any one of the plurality of scan lines $S_1$ and $S_2$ so that the RGB image is provided to the subpixels $P_R$, $P_G$, and $P_B$ belonging to an appropriate row among the plurality of subpixels $P_R$, $P_G$, and $P_B$ arranged in a matrix form according to the scan control signal. Also, the data driver 104a may output the RGB image signal through the plurality of data lines $D_1$, $D_2$, and $D_3$, and the RGB image signal output by the data driver 104a may be provided to the subpixels $P_R$, $P_G$, and $P_B$ belonging to the row selected by the scan driver 104b.

As such, the data driver 104a and the scan driver 104b may sequentially provide the RGB image signals to the plurality of subpixels $P_R$, $P_G$, and $P_B$ included in the light emitting diode panel 103.

Each of the plurality of subpixels $P_R$, $P_G$, and $P_B$ may include scan transistors 201, 301, and 401, driving transistors 202, 302, and 402, storage capacitors 203, 303, and 403, and light emitting elements 200, 300, and 400.

The scan transistors 201, 301, and 401 may be thin film transistors (TFT) including a control terminal (Gate) T1 and first and second input/output terminals (Source, Drain) T2 and T3. The scan transistors 201, 301, and 401 may allow current flow between the first and second input/output terminals T2 and T3 according to the control signal input to the control terminal T1 (turn-on), or may block the current flow between the first and second input/output terminals T2 and T3 (turn-off).

The scan transistors 201, 301, and 401 may be turned on or off according to the scan control signal output from the scan driver 104b. For example, the control terminals T1 of the scan transistors 201, 301, 401 may be connected to the scan lines $S_1$ and $S_2$, and the first input/output terminal T2 of the scan transistors 201, 301, and 401 may be connected to the data lines $D_1$, $D_2$, and $D_3$.

When the activation signal is received from the scan driver 104b to the control terminal T1, the scan transistors 201, 301, and 401 may be turned on. The scan transistors 201, 301, and 401 may receive the RGB image signals of the data lines $D_1$, $D_2$, and $D_3$ through the first input/output terminal T2 and output the RGB image signals of the data lines $D_1$, $D_2$, and $D_3$ through the second input/output terminal T3. Also, when the activation signal is not received from the scan driver 104b to the control terminal T1, the scan transistors 201, 301, and 401 may be turned off.

The driving transistors 202, 302, and 402 may be thin film transistors including a control terminal T4 and first and second input/output terminals T5 and T6. The driving transistors 202, 302, and 402 may allow the current flow between the first and second input/output terminals T5 and T6 according to the control signal input to the control terminal T4 (turn on), or may block the current flow between the first and second input/output terminals T5 and T6 (turn-off).

The driving transistors 202, 302, and 402 may output the driving current to the light emitting elements 200, 300, and 400 according to the RGB image signal output from the data driver 104a and passing through the scan transistors 201, 301, and 401.

For example, the control terminal T4 of the driving transistors 202, 302, and 402 may be connected to the second input/output terminal T3 of the scan transistors 201, 301, and 401, the first input/output terminal T5 of the driving transistors 202, 302, and 402 may be connected to a power supply VDD, and the second input/output terminal T6 of the scan transistors 201, 301, and 401 may be connected to the light emitting elements 200, 300, and 400. The driving transistors 202, 302, and 402 may control a magnitude of current flowing between the first input/output terminal T5 and the second input/output terminal T6 according to the RGB image signal input to the control terminal T4. In other words, the driving transistors 202, 302, and 402 may control the magnitude of current supplied to the light emitting elements 200, 300, and 400 according to the RGB image signal.

The storage capacitors 203, 303, and 403 store the RGB image signals input to the driving transistors 202, 302, and 402 through the scan transistors 201, 301, and 401 from the data driver 104a, and may output a voltage corresponding to the RGB image signals. For example, the storage capacitors 203, 303, and 403 may be connected between the control terminal T4 of the driving transistors 202, 302, and 402 and the second input/output terminal T6, and the voltage corresponding to the RGB image signal may be output between the control terminal T4 and the second input/output terminal T6 of the driving transistors 202, 302, and 402. The driving transistors 202, 302, and 402 may control the magnitude of current supplied to the light emitting elements 200, 300, and 400 according to the voltage of the RGB image signal stored in the storage capacitors 203, 303, and 403.

The light emitting elements 200, 300, and 400 may output light of different intensities according to the magnitude of the current supplied from the driving transistors 202, 302, and 402. In other words, the light emitting elements 200, 300, and 400 may output light of different intensities according to the RGB image signal output from the data driver 104a.

In addition, the light emitting elements 200, 300, and 400 may emit light having different wavelengths (different colors) depending on the constituent material. For example, the light emitting diode panel 103 may include the red light emitting element 200 emitting red light, the green light emitting element 300 emitting green light, and the blue light emitting element 400 emitting blue light.

The red light emitting element 200, the green light emitting element 300 and the blue light emitting element 400 may be provided at positions corresponding to the red subpixel $P_R$, the green subpixel $P_G$, and the blue subpixel $P_B$, respectively.

The red light emitting element 200 may output red light having different intensities according to a red image signal (hereinafter referred to as 'R image signal') output from the data driver 104a, the green light emitting element 300 may output green light having different intensities according to a green image signal (hereinafter, referred to as 'G image signal') output from the data driver 104a, and the blue light emitting element 400 may output blue light having different intensities according to a blue image signal (hereinafter, referred to as 'B image signal') output from the data driver 104a.

The light emitting elements 200, 300, and 400 may include the micro light emitting diodes each having the size of 100 um*100 um or less.

As described above, the display apparatus 100 may include the light emitting diode panel 103 having the red light emitting element 200, the green light emitting element 300, and the blue light emitting element 400.

The red light emitting element 200, the green light emitting element 300 and the blue light emitting element 400 may have various structures to emit red light, green light, and blue light, respectively.

Hereinafter, the structures of the red light emitting element 200, the green light emitting element 300 and the blue light emitting element 400 may be described.

Figure 5:
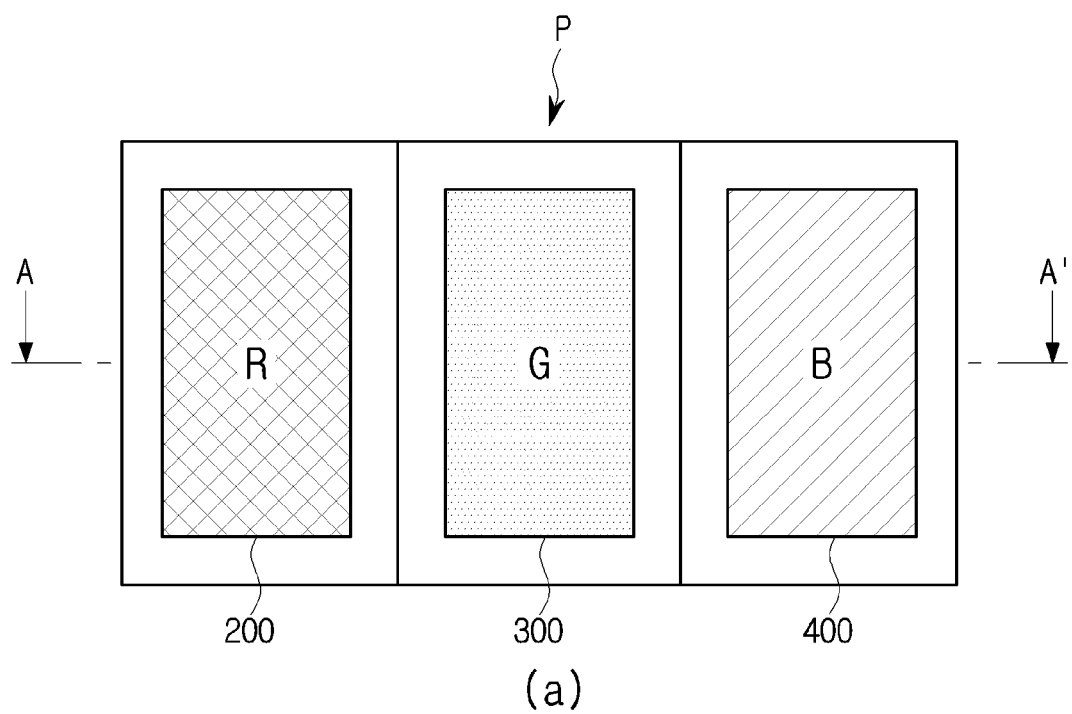
FIG. 5 is a view illustrating an example of light emitting elements included in a display apparatus according to an embodiment.
Figure 5:
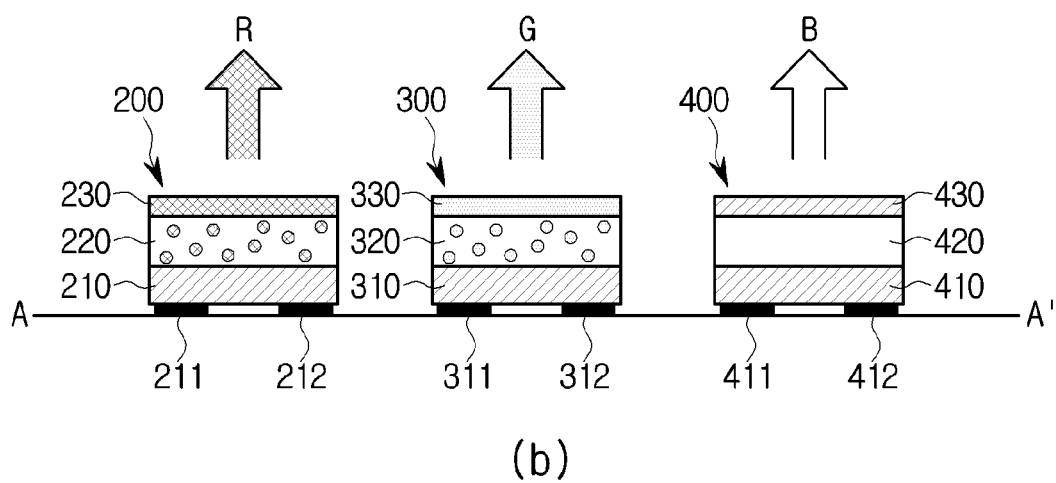
Figure 6:
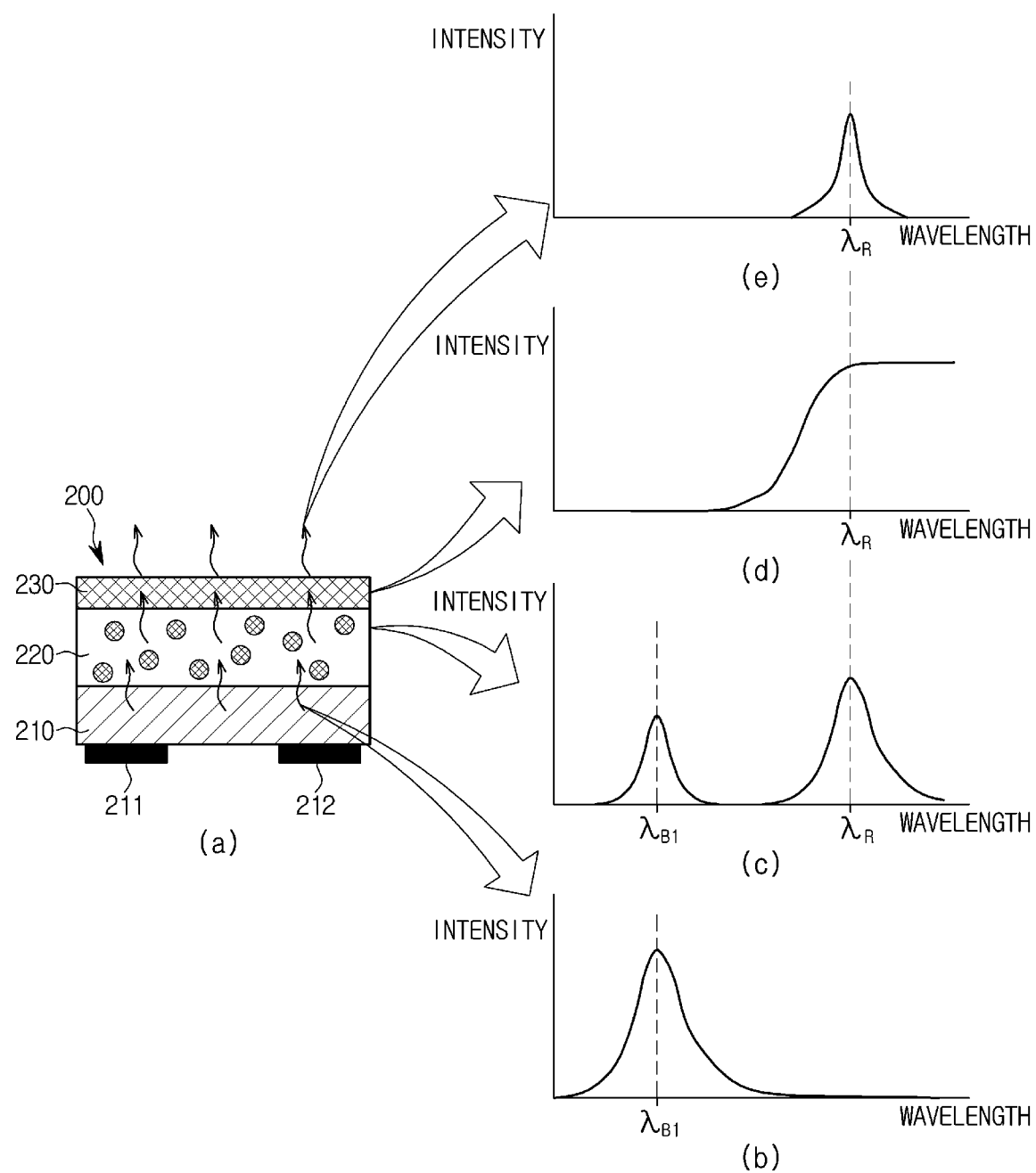
FIG. 6 is a view illustrating a structure of a red light emitting element included in the display apparatus illustrated in FIG. 5 and a spectrum of light output from the red light emitting element.
Figure 7:
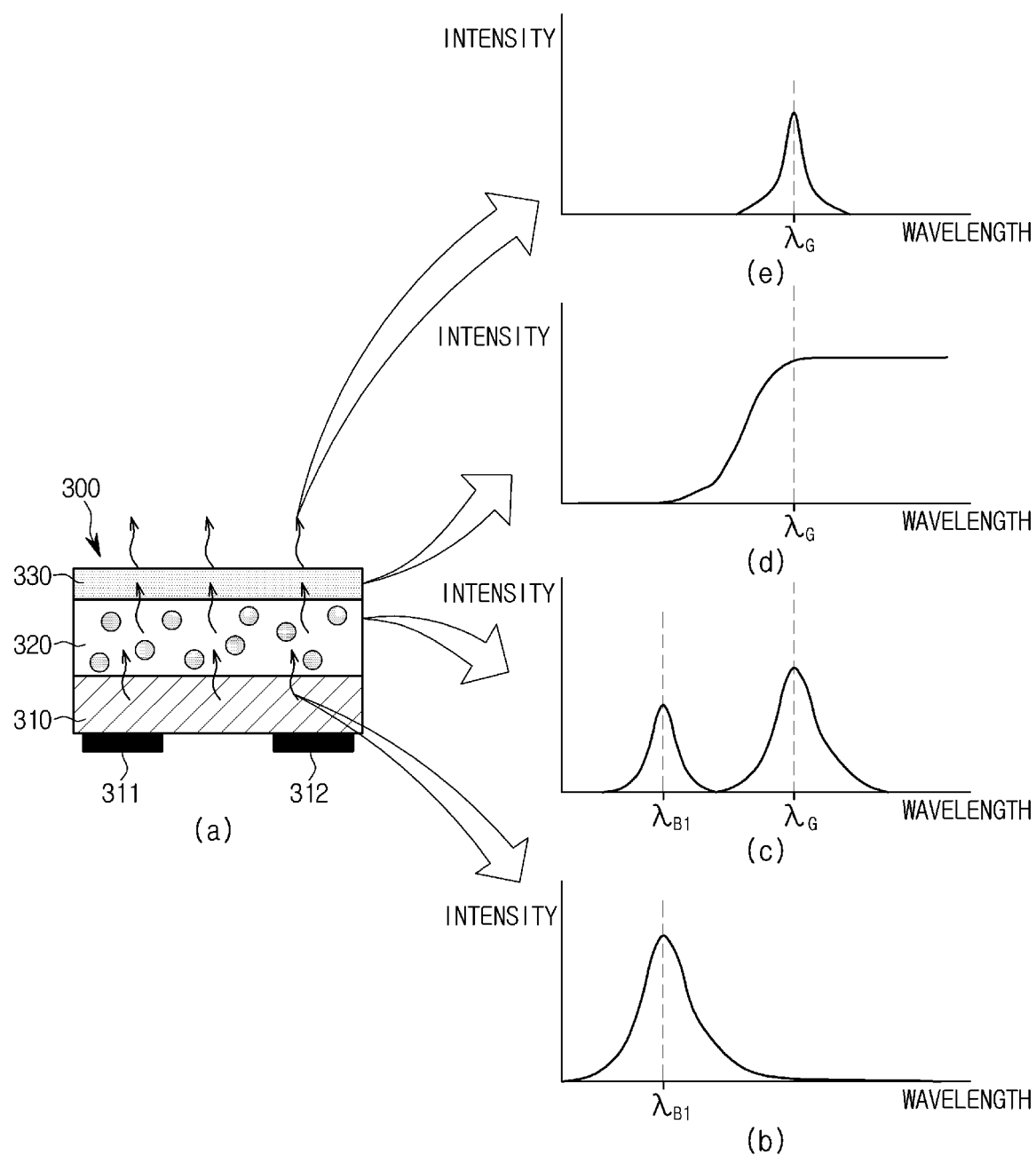
FIG. 7 is a view illustrating a structure of a green light emitting element included in the display apparatus illustrated in FIG. 5 and a spectrum of light output from the green light emitting element.
Figure 8:
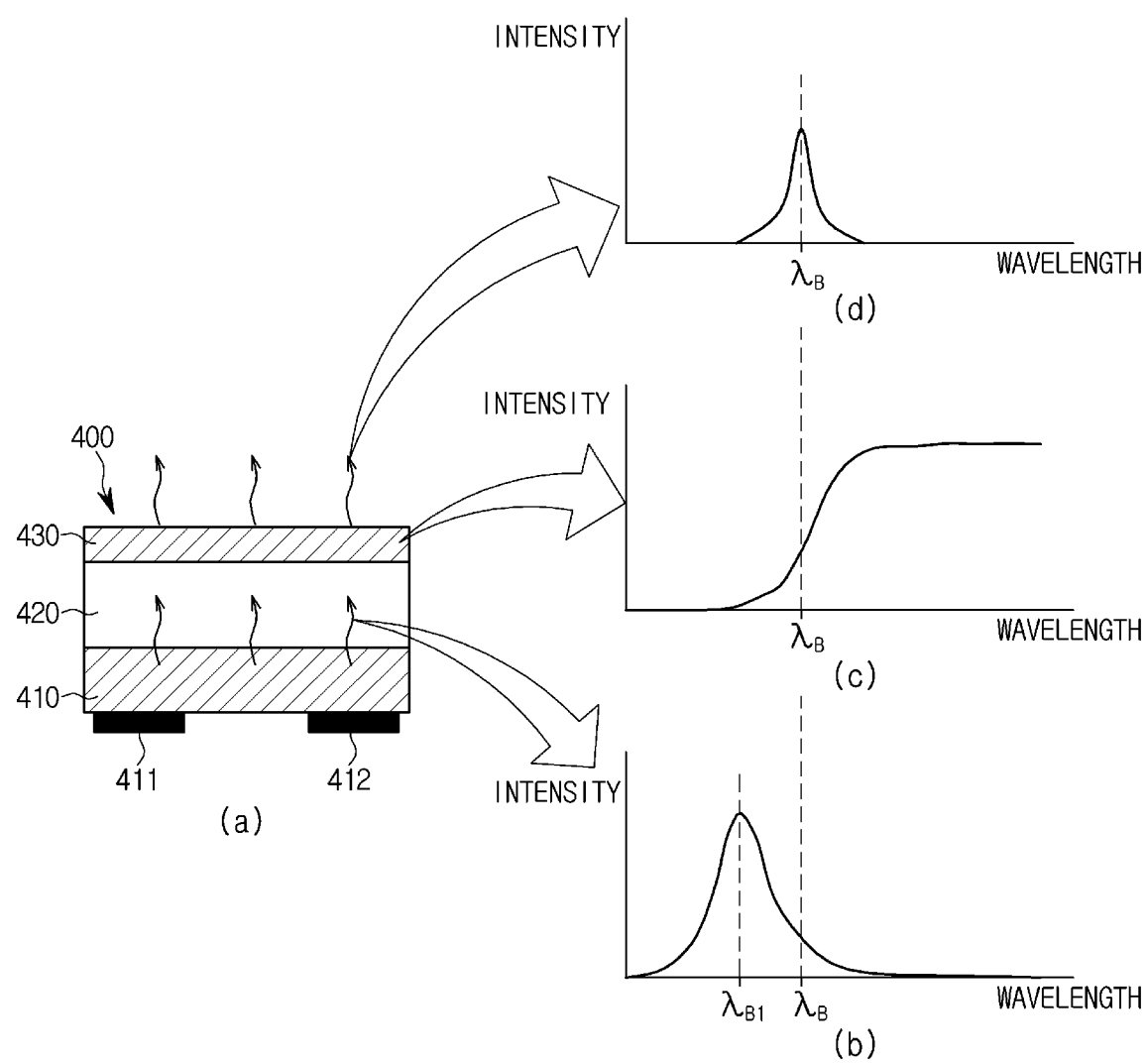
FIG. 8 is a view illustrating a structure of a blue light emitting element included in the display apparatus illustrated in FIG. 5 and a spectrum of light output from the blue light emitting element.

FIG. 5 is a view illustrating an example of light emitting elements included in a display apparatus according to an embodiment. FIG. 6 is a view illustrating a structure of a red light emitting element included in the display apparatus illustrated in FIG. 5 and a spectrum of light output from the red light emitting element. FIG. 7 is a view illustrating a structure of a green light emitting element included in the display apparatus illustrated in FIG. 5 and a spectrum of light output from the green light emitting element. FIG. 8 is a view illustrating a structure of a blue light emitting element included in the display apparatus illustrated in FIG. 5 and a spectrum of light output from the blue light emitting element.

FIG. 5A illustrates one pixel included in the display apparatus 100, and FIG. 5B illustrates cross section A-A' illustrated in FIG. 5A.

As illustrated in FIG. 5A, the pixels P may include the red subpixel $P_R$, the green subpixel $P_G$, and the blue subpixel $P_B$. The red subpixel $P_R$, the green subpixel $P_G$, and the blue subpixel $P_B$ may be arranged side by side.

In addition, the red subpixel $P_R$ may include the red light emitting element 200, the green subpixel $P_G$ may include the green light emitting element 300, and the blue subpixel $P_B$ may include the blue light emitting element 400.

As illustrated in FIGS. 5B and 6A, the red light emitting element 200 may include a first light emitting diode 210, a red light conversion layer 220, and a red filter 230.

The first light emitting diode 210 may include a cathode terminal 211 and an anode terminal 212, and may be connected to a driving circuit through the cathode terminal 211 and the anode terminal 212. The driving circuit may include the scan transistors 201, 301, and 401, the driving transistors 202, 302, and 402, and the storage capacitors 203, 303, and 403 as illustrated in FIG. 4 above. The first light emitting diode 210 may receive the driving current from the driving circuit through the cathode terminal 211 and the anode terminal 212 and emit light. For example, as illustrated in FIG. 6B, the first light emitting diode 210 may emit the light having a maximum intensity at a wavelength $\lambda B1$ similar to a blue wavelength (hereinafter referred to as 'light having the wavelength similar to the blue wavelength').

The red light conversion layer 220 may absorb light emitted from the first light emitting diode 210, and may emit light having a maximum intensity at a red wavelength $\lambda R$ (hereinafter referred to as 'light having the red wavelength'). In other words, the red light conversion layer 220 may convert light having the wavelength $\lambda B1$ similar to the blue wavelength to light having the red wavelength $\lambda R$.

For example, the red light conversion layer 220 may include quantum dots for changing the wavelength of incident light. The quantum dots may refer to small sphere-shaped semiconductor particles a size of a nanometer (nm, 1,000,000,000ths of a meter), and may have a size of approximately 2 nm to 10 nm. The quantum dots may be composed of a core composed of cadmium selenite (CdSe), cadmium telluride (CdTe), cadmium sulfide (CdS), or the like, and a shell composed of zinc sulfide (ZnS).

The quantum dots may have different optical characteristics than bulk materials of the same material. For example, the quantum dots may emit light when a voltage is applied, or emit light of a specific wavelength when light is incident. In other words, the quantum dots may output light having a wavelength different from that of the incident light.

The wavelength of the light output by the quantum dots may vary depending on the size of the quantum dots. An energy band gap between a valence band and a conduction band may vary depending on the size of the quantum dots, and the wavelength of light emitted from the quantum dots may vary depending on the size of the quantum dots.

For example, in the case of cadmium selenite (CdSe) quantum dots, when a diameter of the quantum dots is approximately 10 nm or less, the energy band gap may be increased by a quantum confinement effect. As the energy band gap increases, the wavelength of light emitted from the quantum dots may be shortened (a frequency of light emitted from the quantum dots may be increased). In other words, the cadmium selenite (CdSe) bulk may emit the red light, but the cadmium selenite (CdSe) quantum dots may emit yellow light, the green light, and the blue light as its size decreases.

As such, the quantum dots may emit light of different wavelengths (different colors) depending on the size. For example, the quantum dots with a diameter of approximately 2.5 nm may emit approximately blue light, and the quantum dots with a diameter of approximately 4 nm may emit approximately green light. In addition, the quantum dots with a diameter of approximately 7 nm may emit approximately red light.

The red light conversion layer 220 may include the quantum dots capable of emitting the red light. For example, the red light conversion layer 220 may include the quantum dots having the diameter of approximately 7 nm.

In addition, the red light conversion layer 220 may include a red fluorescent material that converts light having the wavelength λB1 similar to the blue wavelength to light having the red wavelength λR.

As illustrated in FIG. 6C, the light emitted from the red light conversion layer 220 may include light emitted from the first light emitting diode 210 and passing through the red light conversion layer 220 (light having the wavelength similar to the blue red wavelength), and light whose wavelength is converted by the red light conversion layer 220 (light having the blue wavelength).

The red filter 230 may pass light having the red wavelength λR among the incident light, and may block light having a wavelength different from the red light. Particularly, the red filter 230 may pass light having the red wavelength λR and block light having the wavelength λB1 similar to the blue wavelength.

The red filter 230 is not limited to an optical filter that passes light having the red wavelength λR. For example, as illustrated in FIG. 6D, the red filter 230 may include the optical filter that blocks light (e.g., blue light) having the wavelength shorter than the red wavelength λR and passes light having the wavelength longer than the red wavelength λR.

A part of the light (light of the color similar to blue) emitted from the first light emitting diode 210 included in the red light emitting element 200 may be changed to red light while passing through the red light conversion layer 220, and the other part of the light emitted from the first light emitting diode 210 (light of the color similar to blue) may be blocked by the red filter 230. As a result, as illustrated in FIG. 6E, the red light emitting element 200 may emit light having the maximum intensity at the red wavelength λR.

At this time, the wavelength deviation of the red light emitted from the red light emitting element 200 may be very small (may be approximately 2 nm or less). As described above, the blue light emitted from the first light emitting diode 210 may be converted into red light by the red light conversion layer 220, and the wavelength of light emitted from the red light conversion layer 220 may depend on the size of the quantum dots. The size of the red quantum dots may be adjusted very precisely, and the variation in size between the quantum dots is very small. Therefore, the wavelength deviation of the light emitted from the red light conversion layer 220 may also be very small.

As illustrated in FIGS. 5B and 7A, the green light emitting element 300 may include a second light emitting diode 310, a green light conversion layer 320, and a green filter 330.

The second light emitting diode 310 may receive the driving current from the driving circuit through a cathode terminal 311 and an anode terminal 312. For example, as illustrated in FIG. 7B, the second light emitting diode 310 may emit light having the wavelength λB1 similar to the blue wavelength.

The green light conversion layer 320 may absorb light (light having the wavelength similar to the blue wavelength) emitted from the second light emitting diode 310, and may emit light having the maximum intensity at a green wavelength λG (hereinafter referred to as 'light having the green wavelength'). In other words, the red light conversion layer 220 may convert light having the wavelength λB1 similar to the blue wavelength into light having the green wavelength λG.

The green light conversion layer 320 may include the quantum dots capable of emitting the green light. For example, the green light conversion layer 320 may include the quantum dots having the diameter of approximately 4 nm.

In addition, the green light conversion layer 320 may include a green fluorescent material that converts light having the wavelength λB1 similar to the blue wavelength to light having the green wavelength λG.

As illustrated in FIG. 7C, the light emitted from the green light conversion layer 320 may include light emitted from the second light emitting diode 310 and passing through the green light conversion layer 320 (light having the wavelength similar to the blue wavelength), and light whose wavelength is converted by the green light conversion layer 320 (light having the green wavelength).

The green filter 330 may pass light having the green wavelength λG among the incident light, and may block light having a wavelength different from the green light. Particularly, the green filter 330 may pass light having the green wavelength λG whose wavelength is converted by the green light conversion layer 320, and may block light having the wavelength λB1 similar to the blue wavelength passed through the green light conversion layer 320.

The green filter 330 is not limited to the optical filter that passes the wavelength corresponding to green light. For example, as illustrated in FIG. 7D, the green filter 330 may include the optical filter that blocks light (e.g., blue light) having the wavelength shorter than the green wavelength λG and passes light having the wavelength longer than the green wavelength λG.

A part of the light of the color similar to blue emitted from the second light emitting diode 310 included in the green light emitting element 300 may be changed to green light while passing through the green light conversion layer 320, and the other part of the light may be blocked by the green filter 330. As a result, as illustrated in FIG. 7E, the green light emitting element 300 may emit light having the maximum intensity at the green wavelength λG.

At this time, the wavelength deviation of the green light emitted from the green light emitting element 300 may be very small (may be approximately 2 nm or less). This is because the size of the green quantum dots may be adjusted very precisely, and the variation in the size between the quantum dots is very small.

As illustrated in FIGS. 5B and 8A, the blue light emitting element 400 may include a third light emitting diode 410, a transparent resin layer 420, and a blue filter 430.

The third light emitting diode 410 may receive the driving current from the driving circuit through a cathode terminal 411 and an anode terminal 412. For example, as illustrated in FIG. 8B, the third light emitting diode 410 may emit light having the wavelength λB1 similar to the blue wavelength.

The transparent resin layer 420 may pass light emitted from the third light emitting diode 410 (light having the wavelength similar to the blue wavelength). The transparent resin layer 420 may be composed of various transparent resins such as PC (Polycarbonate), PES (Polyether Sulfone), PMMA (Polymethyl Methacrylate), PVA (Polyvinyl alcohol), and PI (Polyimide).

As illustrated in FIG. 8C, the blue filter 430 may pass light having the blue wavelength λB among the incident light and block light having a wavelength different from the blue light. Particularly, the blue filter 430 may pass light having the blue wavelength λB among light emitted from the third light emitting diode 410 and block light having the wavelength λB1 similar to the blue wavelength.

The blue filter 430 may reduce the wavelength deviation of the light (light having the wavelength similar to the blue wavelength) emitted from the third light emitting diode 410.

The wavelength deviation of the light emitted from the third light emitting diode 410 may be relatively large (approximately 10 nm or more). As the light emitting diode, a mixed semiconductor such as gallium arsenide (GaAs), indium gallium nitride (InGaN), and gallium nitride (GaN) may be used. The light emitting diode may be manufactured by growing a first epitaxial layer containing a first impurity on a substrate and then growing a second epitaxial layer containing a second impurity. The light may be emitted at a boundary (PN junction) between the first epitaxial layer including the first impurity and the second epitaxial layer including the second impurity.

At this time, the wavelength of the light emitted from the light emitting diode may be changed according to a mixing ratio of base materials Ga, As, In, N, etc., a concentration of the first impurity contained in the first epitaxial layer and/or a concentration of the second impurity contained in the second epitaxial layer. It is known that the blue light emitting diode has the wavelength deviation of approximately 10 nm or more due to a variation in the concentration of the first impurity and/or a variation in the concentration of the second impurity.

The light emitted from the third light emitting diode 410 (light having the wavelength similar to the blue wavelength) has the wavelength deviation of approximately 10 nm or more, and thus, the color gamut of the display apparatus 100 may be reduced after correction of the wavelength deviation to increase display color uniformity.

In order to reduce the wavelength deviation of the blue light emitted from the third light emitting diode 410, the third light emitting diode 410 may output light having a maximum intensity at a wavelength (approximately 440 nm to 450 nm) shorter than the blue wavelength (approximately 465 nm). The blue filter 430 may block light having a wavelength shorter than the blue wavelength (approximately 465 nm).

As a result, the light passing through the blue filter 430 may have the maximum intensity at approximately the blue wavelength (approximately 465 nm). In addition, the wavelength deviation of the light passing through the blue filter 430 may be reduced to approximately 2 nm or less. In other words, the wavelength deviation of the blue light emitted from the blue light emitting element 400 may be approximately 2 nm or less.

Hereinafter, reducing the wavelength deviation of the blue light emitted from the blue light emitting element 400 will be described in more detail.

Figure 9:
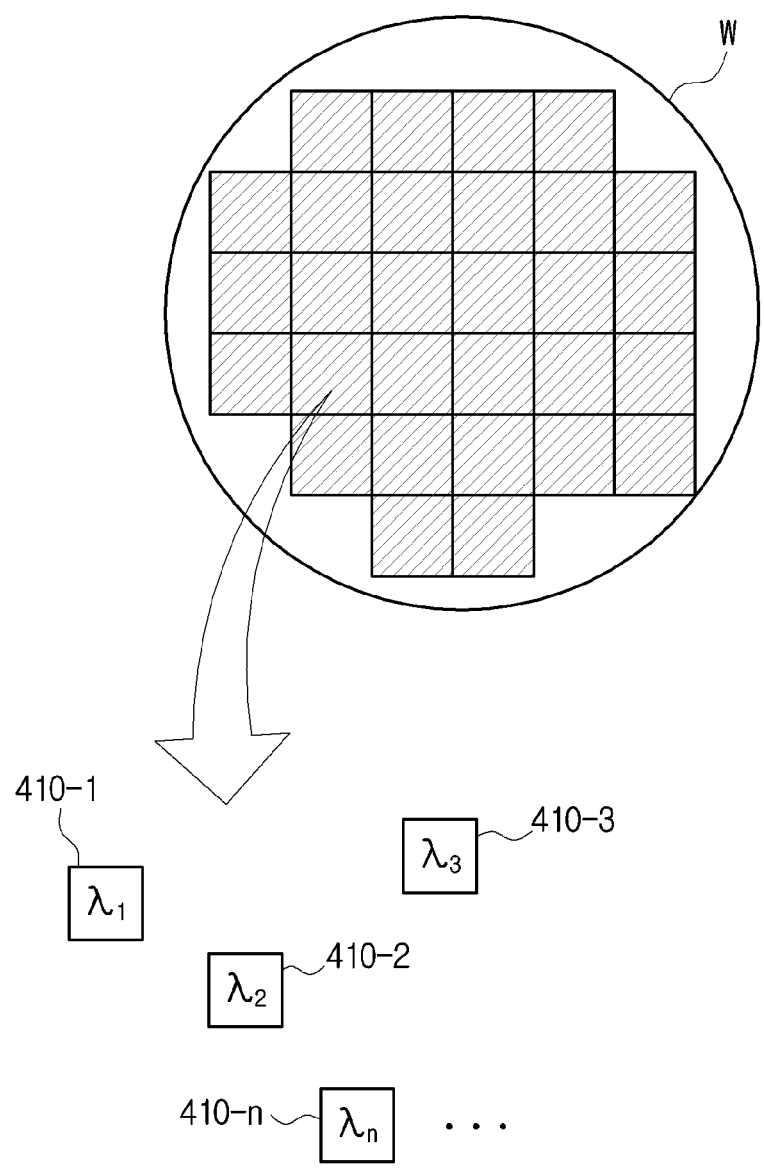
FIGS. 9 and 10 are views illustrating a wavelength deviation of light output from a blue light emitting diode included in the display apparatus illustrated in FIG. 5.
Figure 10:
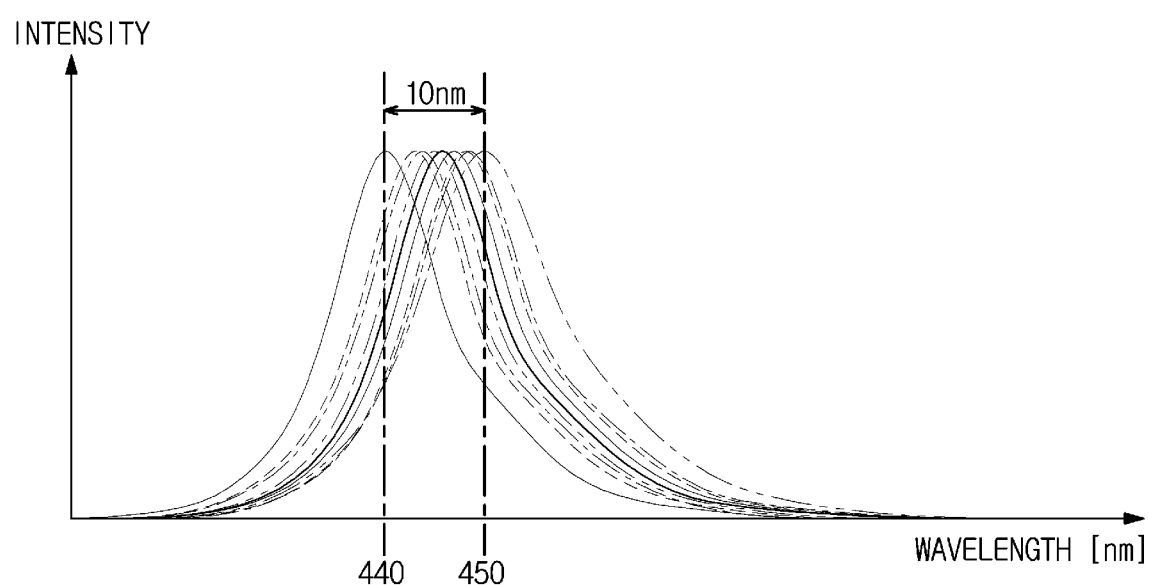
Figure 11:
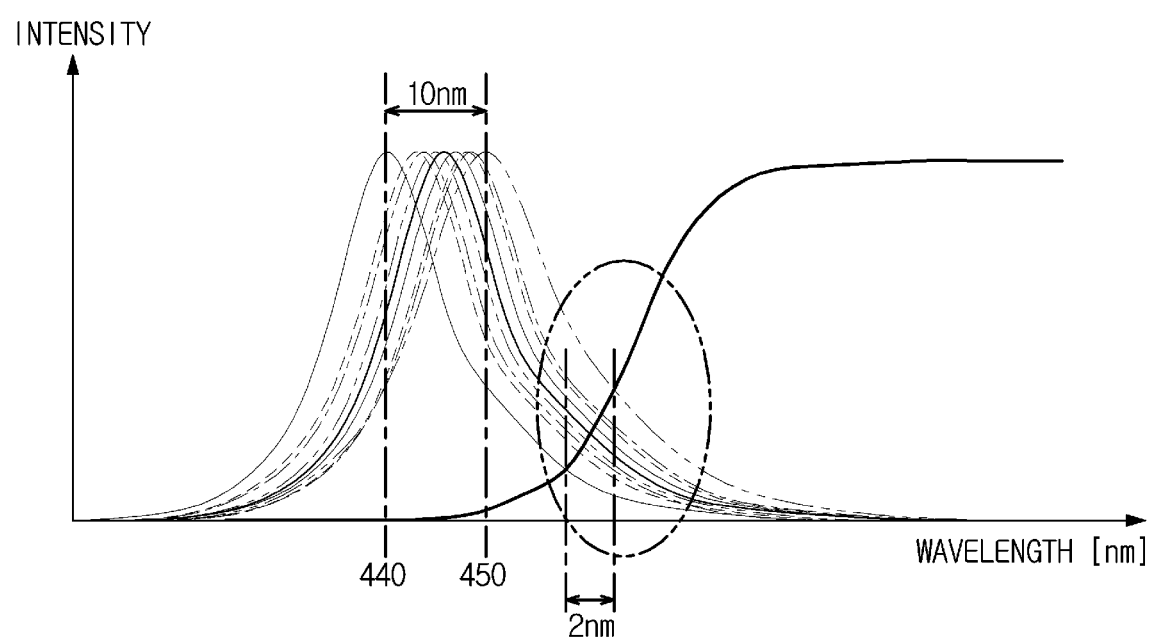
FIGS. 11, 12, and 13 are views illustrating a wavelength deviation of light output from a blue light emitting element included in the display apparatus illustrated in FIG. 5.
Figure 12:
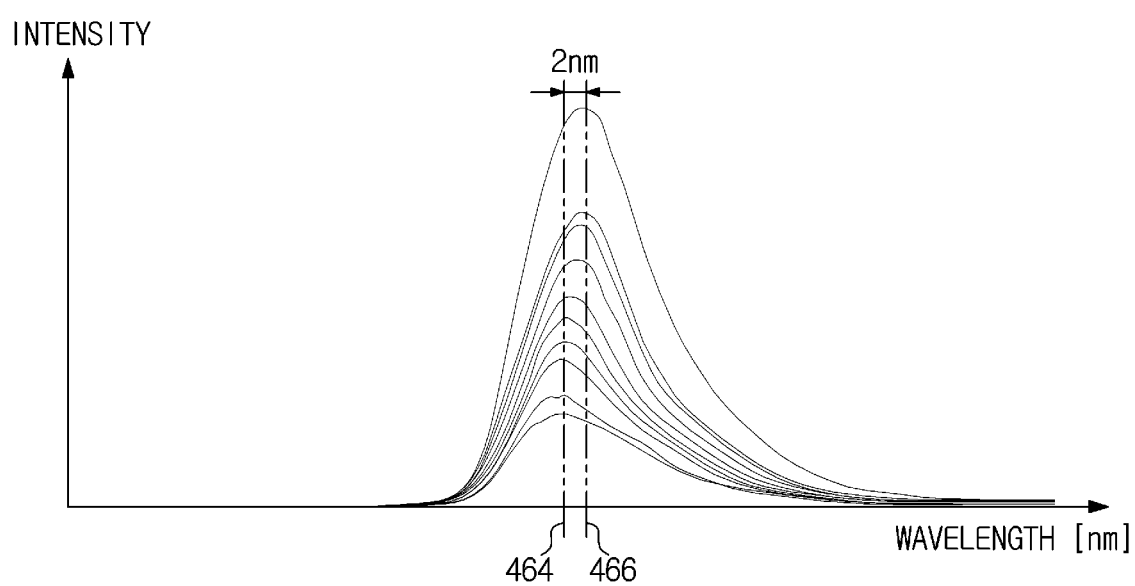
Figure 13:
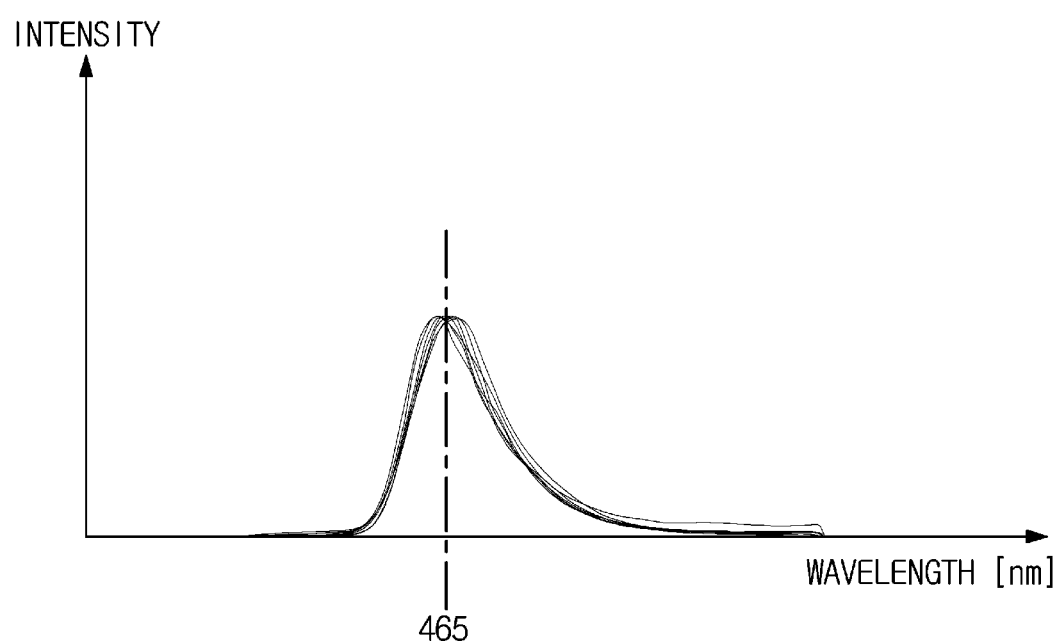

FIGS. 9 and 10 are views illustrating a wavelength deviation of light output from a blue light emitting diode included in the display apparatus illustrated in FIG. 5. FIGS. 11, 12, and 13 are views illustrating a wavelength deviation of light output from a blue light emitting element included in the display apparatus illustrated in FIG. 5.

As illustrated in FIG. 9, a plurality of blue light emitting diodes 410-1, 410-2, 410-3, . . . , and 410-n may be manufactured on a single wafer W. For example, the blue light emitting diodes 410-1, 410-2, 410-3, . . . , and 410-n may be composed of gallium nitride (GaN), and may emit light having the maximum intensity at the wavelength similar to the blue wavelength.

Particularly, a PN junction may be formed by growing the first epitaxial layer containing the first impurity on the wafer W forming the substrate and then growing the second epitaxial layer containing the second impurity. A PN junction diode may be manufactured by cutting the wafer W on which the PN junction is formed to a predetermined size, and the PN junction diode may become the blue light emitting diode capable of emitting the light.

For example, by cutting the wafer W on which the PN junction is formed, the first blue light emitting diode 410-1, the second blue light emitting diode 410-2, the third blue light emitting diode 410-3, and the n-th blue light emitting diode 410-n from the single wafer W may be manufactured.

At this time, depending on the position in the single wafer W, the mixing ratio of the base materials Ga and N, the concentration of the first impurity contained in the substrate and/or the concentration of the second impurity contained in the second epitaxial layer may be different from each other. In addition, the wavelength of light emitted from the light emitting diode may change according to the mixing ratio of the base materials Ga and N, the concentration of the first impurity contained in the first epitaxial layer and/or the concentration of the second impurity contained in the second epitaxial layer.

As a result, the blue light emitting diodes 410-1, 410-2, 410-3, . . . , and 410-n manufactured on the single wafer W may emit light of different wavelengths. In other words, the wavelength deviation of the light emitted from the blue light emitting diodes 410-1, 410-2, 410-3, . . . , and 410-n manufactured on the single wafer W may be generated. It is known that the wavelength deviation between the blue light emitting diodes 410-1, 410-2, 410-3, . . . , and 410-n is approximately 10 nm.

For example, as illustrated in FIG. 10, a wavelength λ1 of light emitted from the first blue light emitting diode 410-1, a wavelength λ2 of light emitted from the second blue light emitting diode 410-2, a wavelength λ3 of light emitted from the third blue light emitting diode 410-3, and a wavelength λn of light emitted from the n-th blue light emitting diode 410-n manufactured by the single wafer W may be different from each other.

In addition, the deviation between the wavelengths λ1, λ2, λ3, . . . and λn of light emitted from the first to n-th blue light emitting diodes 410-1, 410-2, 410-3, . . . , and 410-n may be approximately 10 nm. Particularly, the first to n-th blue light-emitting diodes 410-1, 410-2, 410-3, . . . , and 410-n may emit light having the wavelength of 440 nm to 450 nm.

As such, the plurality of blue light emitting diodes 410-1, 410-2, 410-3, . . . , and 410-n manufactured by the single wafer W may emit light having the wavelength similar to blue, and the deviation may exist between the wavelengths of light emitted from the plurality of blue light emitting diodes 410-1, 410-2, 410-3, . . . , and 410-n. In addition, the light emitted from the plurality of blue light emitting diodes 410-1, 410-2, 410-3, . . . , and 410-n may have any wavelength of 440 nm to 450 nm.

In addition, the display apparatus 100 may include the plurality of blue light emitting elements 400, and the plurality of blue light emitting elements 400 may include the plurality of blue light emitting diodes 410-1, 410-2, 410-3, . . . , and 410-n and a plurality of the blue filters 430, respectively.

The blue filter 430 may pass light having approximately the blue wavelength or light having the wavelength longer than approximately the blue wavelength λB, and may block light having the wavelength shorter than approximately the blue wavelength λB.

For example, the blue filter 430 may have a characteristic curve as illustrated in FIG. 11. Particularly, the blue filter 430 has a transmittance of about 20% at approximately 462 nm, a transmittance of about 40% at approximately 466 nm, a transmittance of about 60% at approximately 470 nm, and a transmittance of about 80% at approximately 474 nm. In particular, the characteristic curve of the blue filter 430 may cross the spectral curve of the blue light emitting diodes 410-1, 410-2, 410-3, . . . , and 410-*n* at the wavelength of approximately 465 nm.

As a result, the light passing through the blue filter 430 may have the maximum intensity at approximately 465 nm, as illustrated in FIG. 12. Further, the wavelength deviation having the maximum intensity of the light passing through the blue filter 430 may be reduced to approximately 2 nm.

As described above, each of the plurality of blue light emitting diodes 410-1, 410-2, 410-3, . . . , and 410-*n* may emit light having the maximum intensity at the wavelength (approximately 440 nm to 450 nm) shorter than the blue wavelength. In addition, the blue filter 430 may block light having the wavelength shorter than the blue wavelength (approximately 465 nm) and pass light having the wavelength longer than the blue wavelength (approximately 465 nm), and the transmittance may be rapidly increased at the blue wavelength (approximately 465 nm).

As a result, the wavelength deviation of the light passing through the blue filter 430 may be significantly reduced compared to the wavelength deviation of the light emitted from the plurality of blue light emitting diodes 410-1, 410-2, 410-3, . . . , and 410-*n*. In other words, the wavelength deviation of the light emitted from the plurality of blue light emitting elements 400 may be significantly reduced compared to the wavelength deviation of the light emitted from the plurality of blue light emitting diodes 410-1, 410-2, 410-3, . . . , and 410-*n*.

In addition, a luminance correction process may be performed to reduce luminance deviation of light emitted from the plurality of blue light emitting elements 400.

For example, the driving current may be supplied to the blue light emitting element 400, and the luminance of the blue light emitting element 400 may be measured using a separately provided luminance meter (not shown). The driving current supplied to the blue light emitting element 400 may be controlled so that the luminance of the blue light emitting element 400 measured by the luminance meter has a predetermined luminance value.

As illustrated in FIG. 4, each of the plurality of pixels P may further include a compensation circuit to compensate the driving current supplied to the blue light emitting element 400 together with the driving circuit that supplies the driving current to the blue light emitting element 400.

By the compensation circuit provided in the plurality of pixels P, the plurality of blue light emitting elements 400 may emit light having a predetermined luminance value as illustrated in FIG. 13. As a result, the luminance deviation of the light emitted from the plurality of blue light emitting elements 400 may be reduced.

As described above, the blue light emitting element may include the blue light emitting diode and the blue filter. The blue light emitting diode may emit light having the wavelength shorter than the blue wavelength, and the blue filter may block light having the wavelength shorter than the blue wavelength. As a result, the wavelength deviation of the blue light emitted from the plurality of blue light emitting elements may be reduced compared to the wavelength deviation of the light emitted from the blue light emitting diode.

The red light emitting element may include the blue light emitting diode and the red light conversion layer. The red light conversion layer may absorb light emitted from the blue light emitting diode and emit light having the red wavelength. The wavelength deviation of the red light emitted from the red light conversion layer may be reduced compared to the wavelength deviation of the light emitted from the blue light emitting diode.

In addition, the green light emitting element may include the blue light emitting diode and the green light conversion layer. The green light conversion layer may absorb light emitted from the blue light emitting diode and emit light having the green wavelength. The wavelength deviation of the green light emitted from the green light conversion layer may be reduced compared to the wavelength deviation of the light emitted from the blue light emitting diode.

Figure 14:
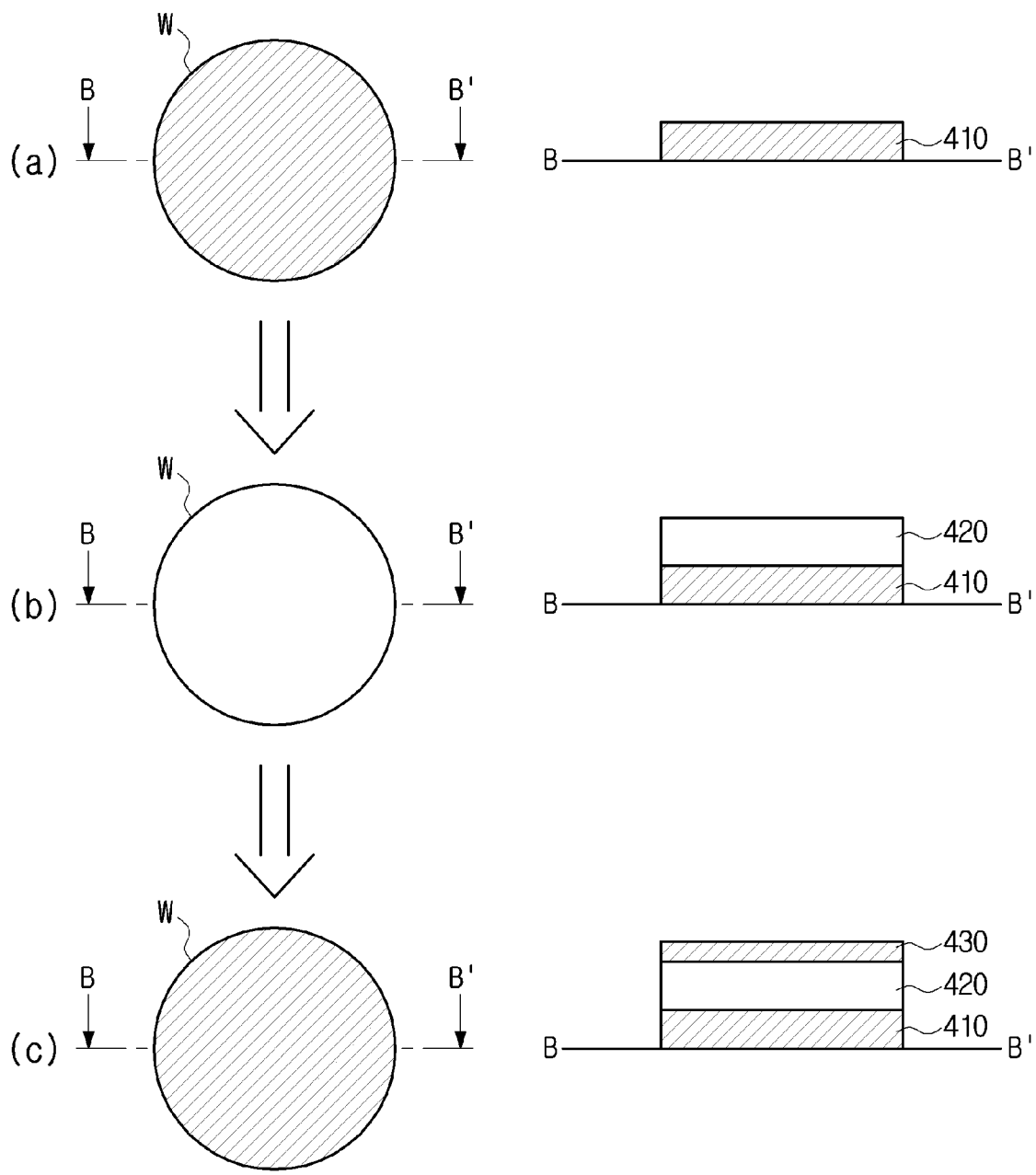
FIG. 14 is a view illustrating a process of manufacturing a blue light emitting element included in the display apparatus illustrated in FIG. 5.
Figure 15:
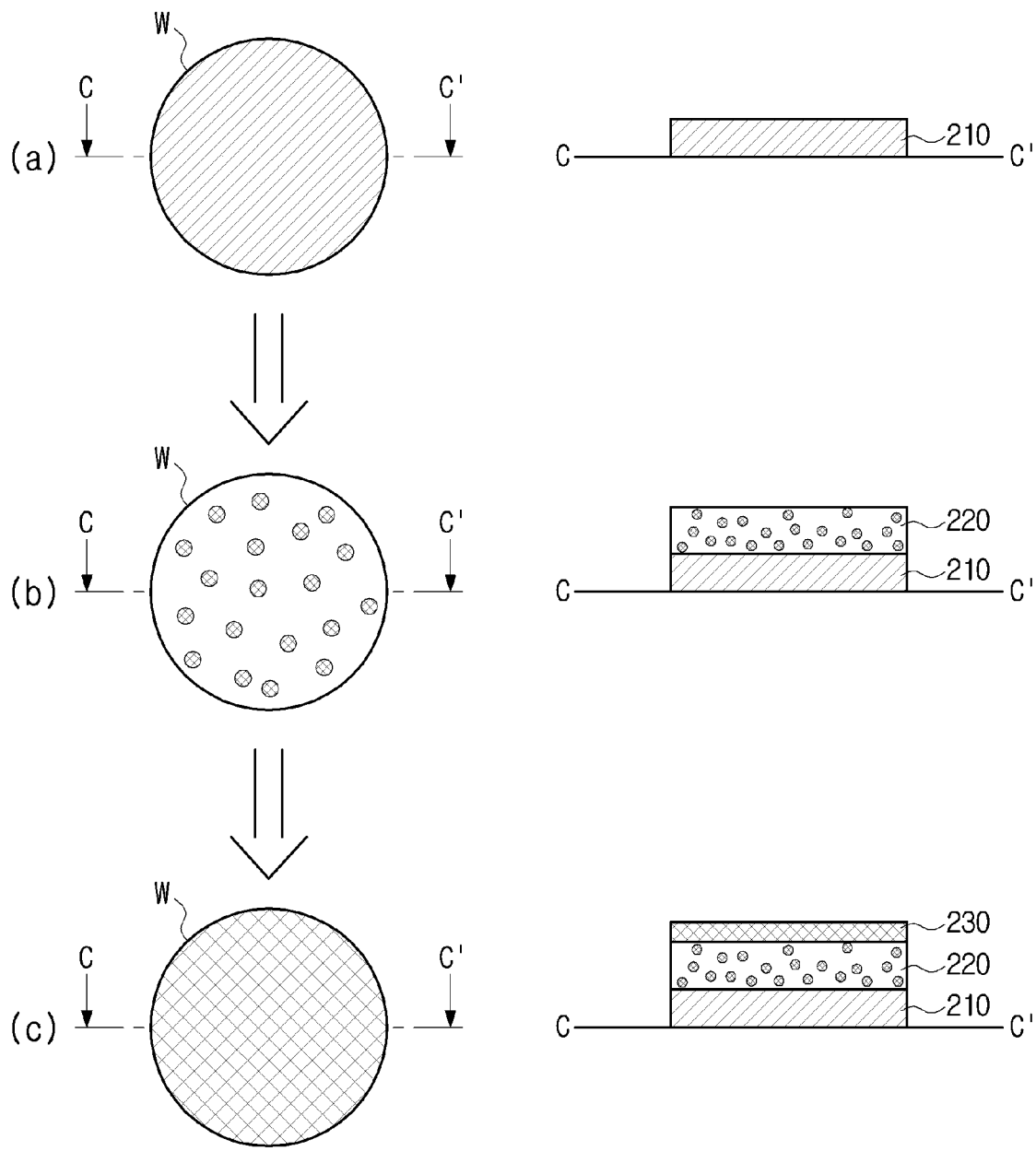
FIG. 15 is a view illustrating a process of manufacturing a red light emitting element illustrated in FIG. 5.
Figure 16:
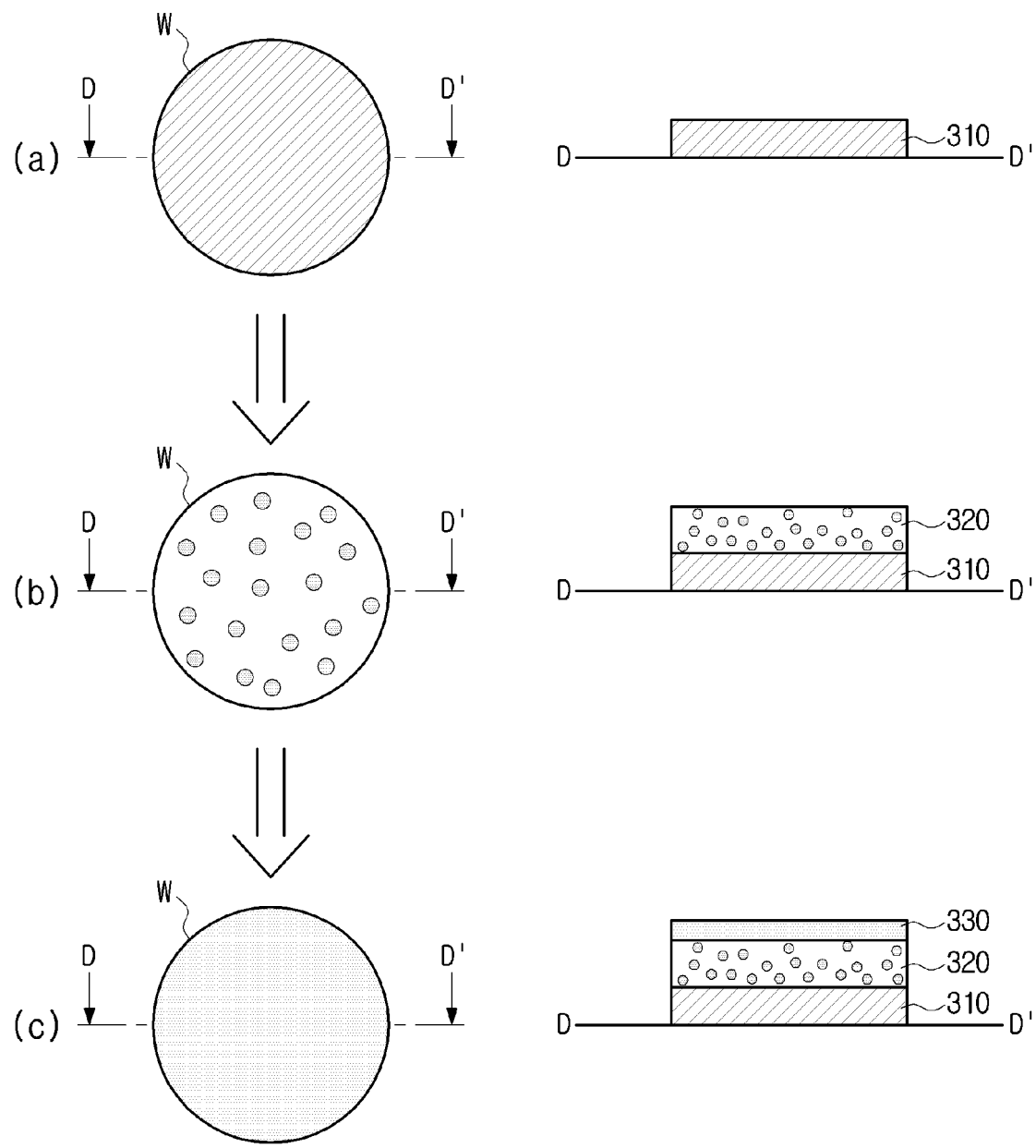
FIG. 16 is a view illustrating a process of manufacturing a green light emitting element illustrated in FIG. 5.

FIG. 14 is a view illustrating a process of manufacturing a blue light emitting element included in the display apparatus illustrated in FIG. 5. FIG. 15 is a view illustrating a process of manufacturing a red light emitting element included in the display apparatus illustrated in FIG. 5. FIG. 16 is a view illustrating a process of manufacturing a green light emitting element included in the display apparatus illustrated in FIG. 5.

The blue light emitting element 400 may include the blue light emitting diode, the transparent resin layer, and the blue filter.

As illustrated in FIG. 14A, the wafer W may be provided, and the plurality of light emitting diodes may be formed on the wafer W. For example, a plurality of the PN junctions may be formed by growing the first epitaxial layer containing the first impurity on the wafer W forming the substrate and then growing the second epitaxial layer containing the second impurity. Each of the plurality of PN junctions may be the light emitting diode.

Thereafter, as illustrated in FIG. 14B, the transparent resin layer 420 may be formed on the wafer W on which the plurality of light emitting diodes are formed. For example, the transparent resin layer 420 may be formed by applying (or coating) a liquid transparent resin onto the wafer W and curing the liquid transparent resin. The transparent resin layer 420 may be formed of various transparent resins such as PC, PES, PMMA, PVA, and PI.

Thereafter, as illustrated in FIG. 14C, the blue filter 430 may be formed on the wafer W on which the transparent resin layer 420 is formed. For example, the blue filter 430 may be formed by applying (or coating) a liquid blue pigment on the transparent resin layer 420 and curing the liquid blue pigment.

Thereafter, the blue light emitting element 400 may be manufactured by cutting the wafer W on which the transparent resin layer 420 and the blue filter 430 are formed to an appropriate size.

The red light emitting element 200 may include the blue light emitting diode, the red light conversion layer, and the red filter.

As illustrated in FIG. 15A, the wafer W may be provided, and the plurality of light emitting diodes may be formed on the wafer W. The wafer W on which the plurality of light emitting diodes are formed may be the same as the wafer W illustrated in FIG. 14A.

Subsequently, as illustrated in FIG. 15B, the red light conversion layer 220 may be formed on the wafer W on which the plurality of blue light emitting diodes are formed. For example, the red light conversion layer 220 may be formed by applying (or coat) a material on which the quantum dots having the diameter of approximately 7 nm and the liquid transparent resin are mixed on the wafer W and curing the material on which the quantum dots and the transparent resin are mixed.

Thereafter, the red filter 230 may be formed on the wafer W on which the red light conversion layer 220 is formed, as illustrated in FIG. 15C. For example, the red filter 230 may be formed by applying (or coating) a liquid red pigment on the red light conversion layer 220 and curing the liquid red pigment.

The green light emitting element 300 may include the blue light emitting diode, the green light conversion layer, and the green filter.

As illustrated in FIG. 16A, the wafer W may be provided, and the plurality of light emitting diodes may be formed on the wafer W. The wafer W on which the plurality of light emitting diodes are formed may be the same as the wafer W illustrated in FIG. 14A.

Subsequently, as illustrated in FIG. 16B, the green light conversion layer 320 may be formed on the wafer W on which the plurality of blue light emitting diodes are formed. For example, the green light conversion layer 320 may be formed by applying (or coat) a material on which the quantum dots having the diameter of approximately 4 nm and the liquid transparent resin are mixed on the wafer W and curing the material on which the quantum dots and the transparent resin are mixed.

Thereafter, the green filter 330 may be formed on the wafer W on which the green light conversion layer 320 is formed, as illustrated in FIG. 16C. For example, the green filter 330 may be formed by applying (or coating) a liquid green pigment on the green light conversion layer 320 and curing the liquid green pigment.

Figure 17:
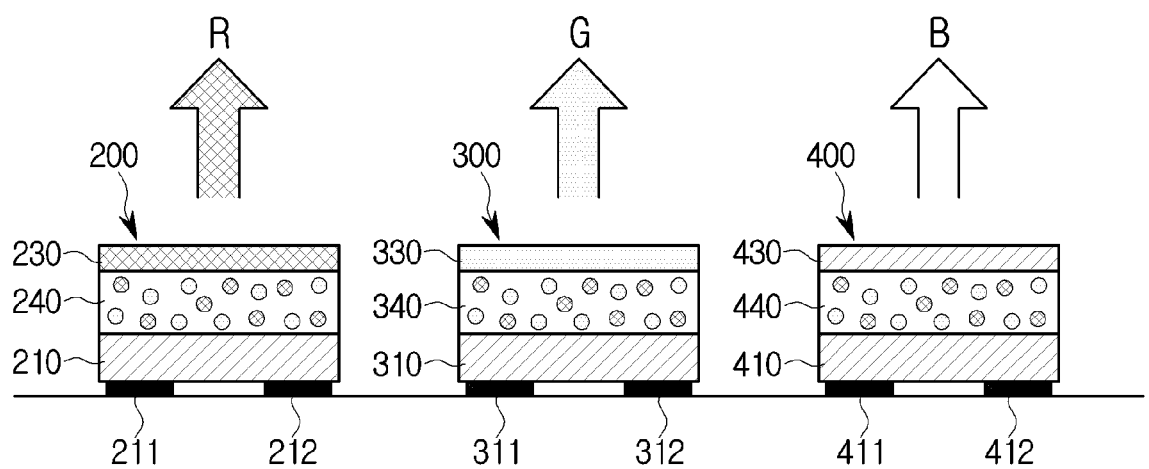
FIG. 17 is a view illustrating another example of light emitting elements included in a display apparatus according to an embodiment.
Figure 18:
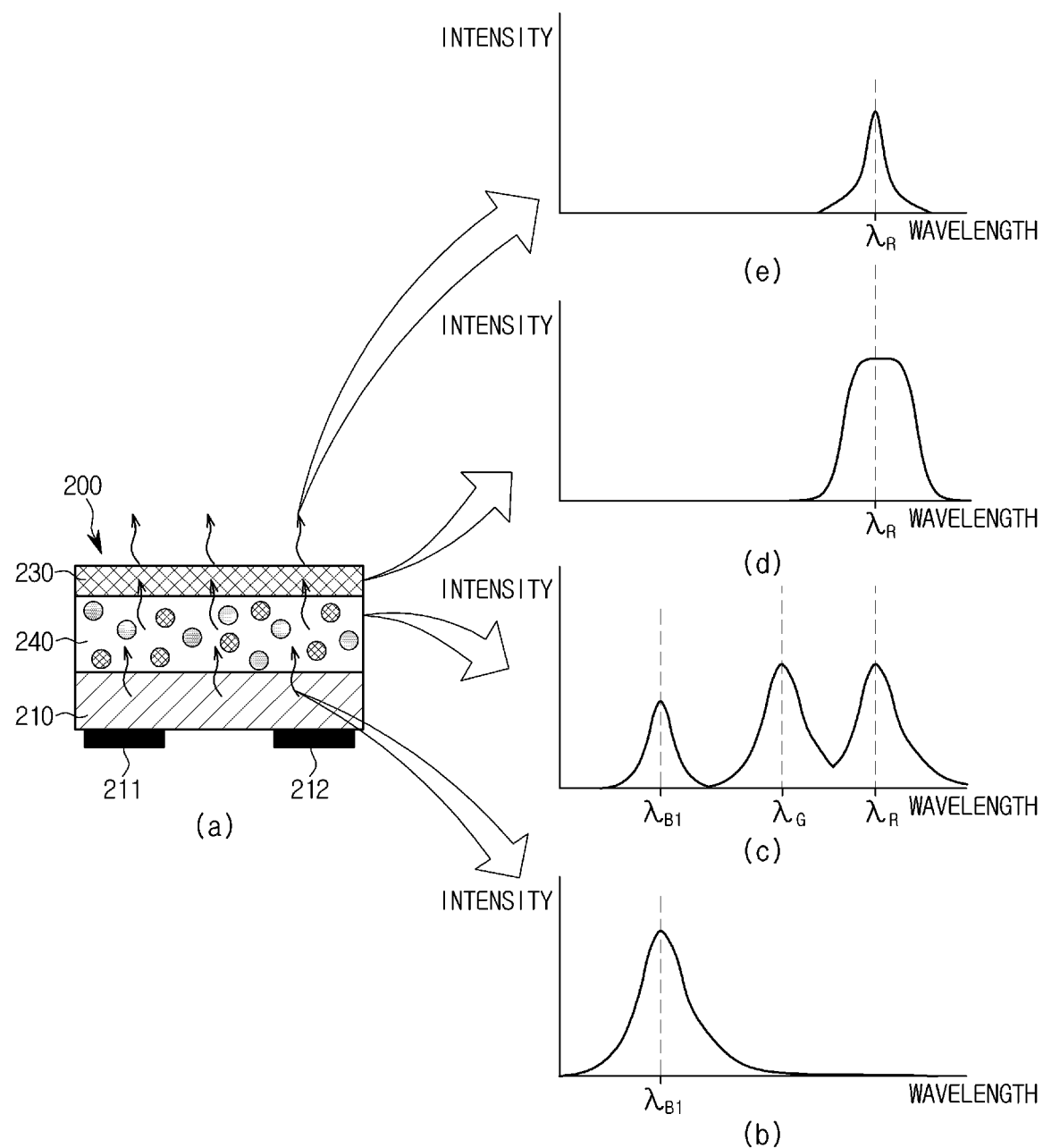
FIG. 18 is a view illustrating a structure of a red light emitting element included in the display apparatus illustrated in FIG. 17 and a spectrum of light output from the red light emitting element.
Figure 19:
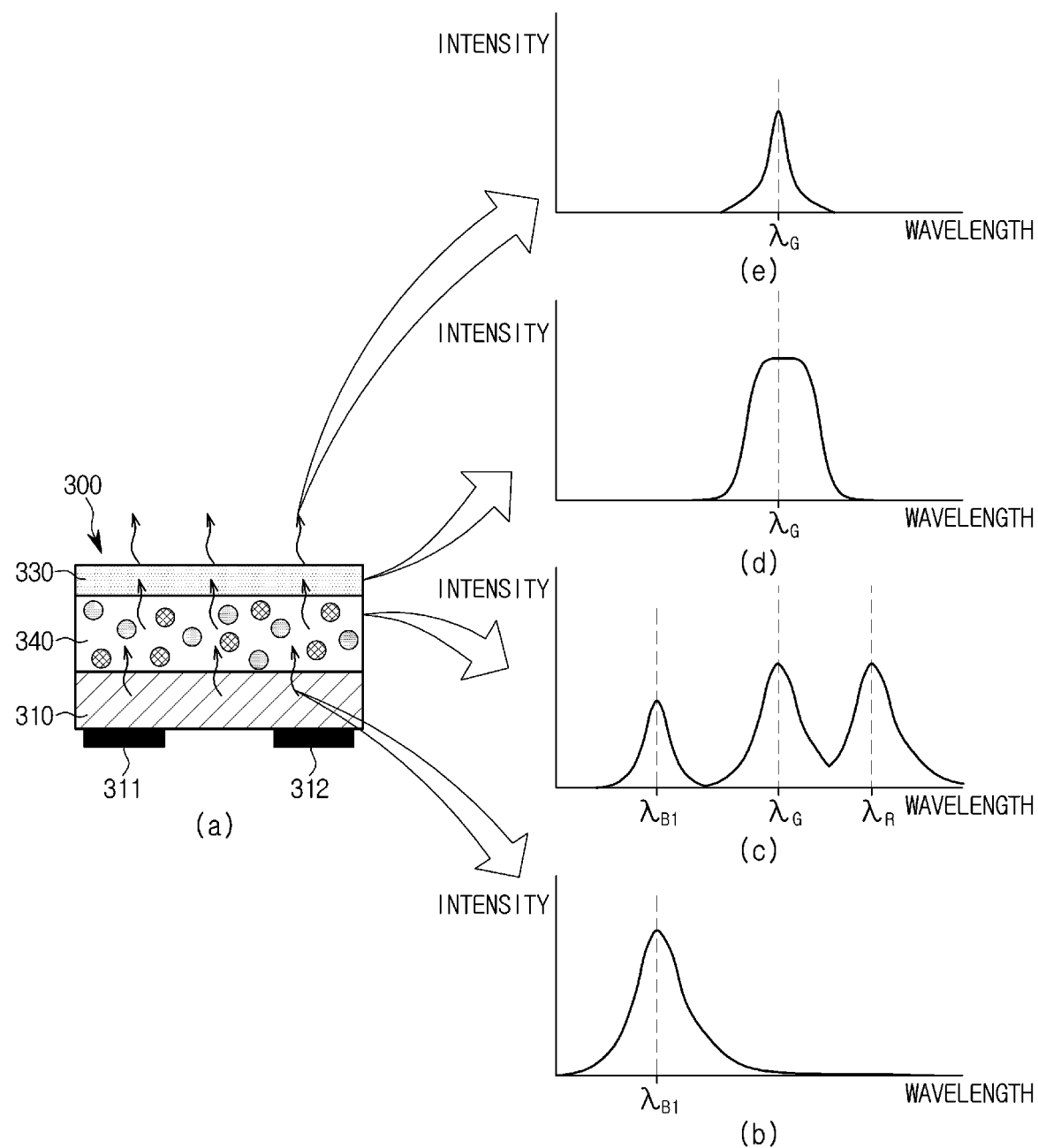
FIG. 19 is a view illustrating a structure of a green light emitting element included in the display apparatus illustrated in FIG. 17 and a spectrum of light output from the green light emitting element.
Figure 20:
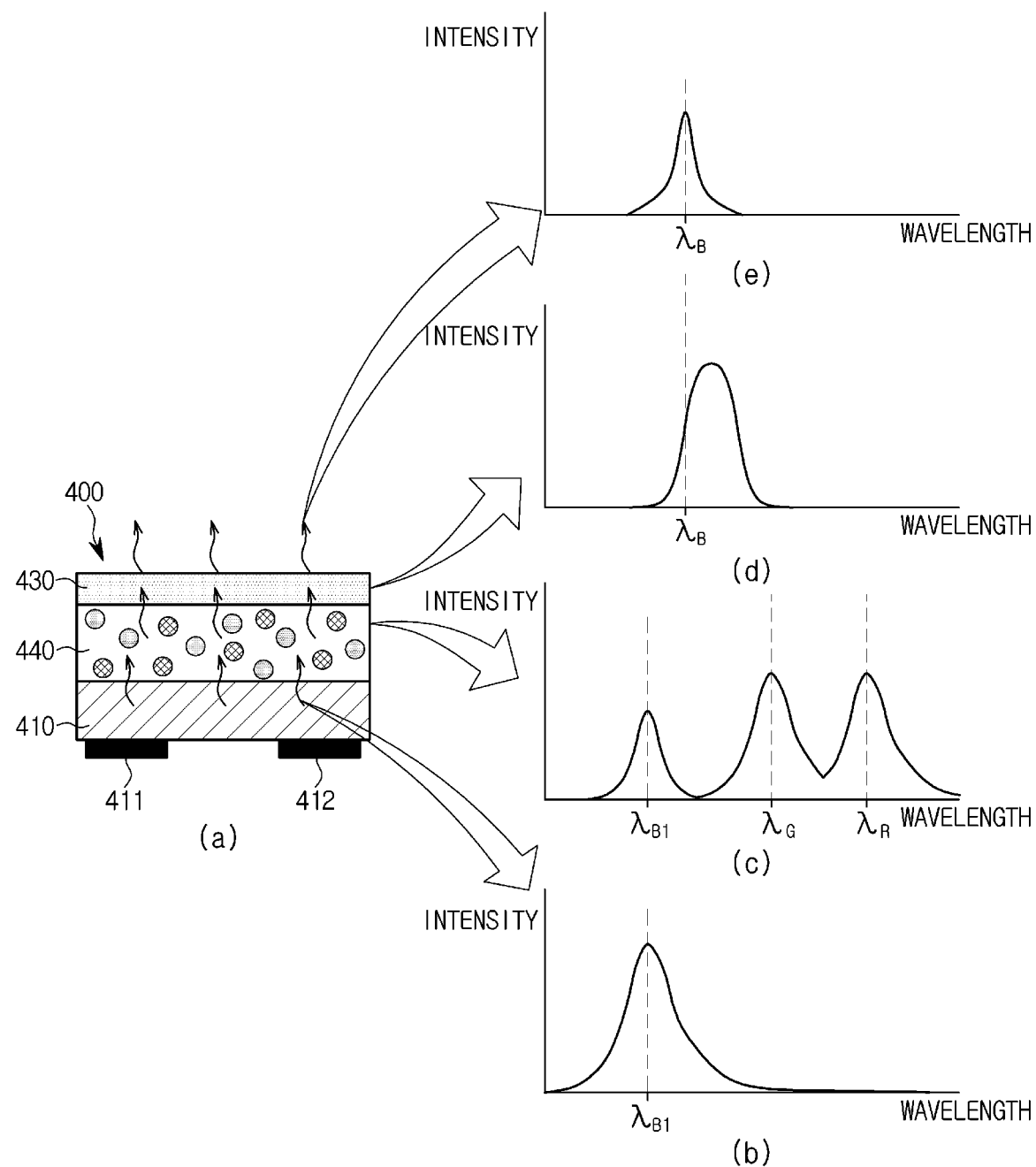
FIG. 20 is a view illustrating a structure of a blue light emitting element included in the display apparatus illustrated in FIG. 17 and a spectrum of light output from the blue light emitting element.

FIG. 17 is a view illustrating another example of light emitting elements included in a display apparatus according to an embodiment. FIG. 18 is a view illustrating a structure of a red light emitting element included in the display apparatus illustrated in FIG. 17 and a spectrum of light output from the red light emitting element. FIG. 19 is a view illustrating a structure of a green light emitting element included in the display apparatus illustrated in FIG. 17 and a spectrum of light output from the green light emitting element. FIG. 20 is a view illustrating a structure of a blue light emitting element included in the display apparatus illustrated in FIG. 17 and a spectrum of light output from the blue light emitting element.

As illustrated in FIG. 17, the pixel P may include the red light emitting element 200, the green light emitting element 300, and the blue light emitting element 400.

As illustrated in FIGS. 17 and 18A, the red light emitting element 200 may include the first light emitting diode 210, a first yellow light conversion layer 240, and the red filter 230.

The first light emitting diode 210 may receive the driving current from the driving circuit through the cathode terminal 211 and the anode terminal 212. For example, as illustrated in FIG. 18B, at the wavelength $\lambda B1$ shorter than the blue wavelength, the light having the maximum intensity (hereinafter referred to as light having the wavelength shorter than the blue wavelength) may be emitted.

The first yellow light conversion layer 240 may absorb light having the wavelength $\lambda B1$ shorter than the blue wavelength emitted from the second light emitting diode 310, and may emit light having the maximum intensity at the red wavelength $\lambda R$ (light having the red wavelength) and light having the maximum intensity at the green wavelength $\lambda G$ (light having the green wavelength). In other words, the first yellow light conversion layer 240 may convert light having the wavelength $\lambda B1$ shorter than the blue wavelength to light having the red wavelength $\lambda R$ and light having the green wavelength $\lambda G$.

For example, the first yellow light conversion layer 240 may include the quantum dots capable of emitting the red light and the quantum dots capable of emitting the green light.

In addition, the first yellow light conversion layer 240 may include a fluorescent material capable of emitting the red light and a fluorescent material capable of emitting the green light.

As illustrated in FIG. 18C, the light emitted from the first yellow light conversion layer 240 may include the light having the wavelength $\lambda B1$ shorter than the blue wavelength that has passed through the first yellow light conversion layer 240, and the light having the red wavelength $\lambda R$ whose wavelength is converted by the first yellow light conversion layer 240 and light having the green wavelength $\lambda G$.

As illustrated in FIG. 18D, the red filter 230 may pass light having the red wavelength $\lambda R$ among the incident light and block light having a wavelength different from the red wavelength $\lambda R$. Particularly, the red filter 230 may pass light having the red wavelength $\lambda R$ and block light having the wavelength $\lambda B1$ shorter than the blue wavelength and light having the green wavelength $\lambda G$.

As a result, as illustrated in FIG. 18E, the red light emitting element 200 may emit light having the maximum intensity at the red wavelength $\lambda R$. In addition, the wavelength deviation of the light emitted from the first light emitting diode 210 may be reduced by the first yellow light conversion layer 240.

As illustrated in FIGS. 17 and 19A, the green light emitting element 300 may include the second light emitting diode 310, a second yellow light conversion layer 340, and the green filter 330.

The second light emitting diode 310 and the second yellow light conversion layer 340 may be the same as the first light emitting diode 210 and the first yellow light conversion layer 240 illustrated in FIG. 18. Particularly, the second light emitting diode 310 may emit light having the wavelength $\lambda B1$ shorter than the blue wavelength, as illustrated in FIG. 19B. In addition, the second yellow light conversion layer 340 may convert the wavelength $\lambda B1$ shorter than the blue wavelength to light having the red wavelength $\lambda R$ and light having the green wavelength $\lambda G$. As illustrated in FIG. 19C, the second yellow light conversion layer 340 may emit light having the wavelength $\lambda B1$ shorter than the blue wavelength, light having the red wavelength $\lambda R$, and light having the green wavelength $\lambda G$.

As illustrated in FIG. 19D, the green filter 330 may pass light having the green wavelength $\lambda B$ among the incident light and may block light having the wavelength different from the green light. Particularly, the green filter 330 may pass light having the green wavelength $\lambda G$, and may block light having the wavelength $\lambda B1$ shorter than the blue wavelength and light having the red wavelength $\lambda R$.

As a result, as illustrated in FIG. 19E, the green light emitting element 300 may emit light having the maximum intensity at the green wavelength $\lambda G$. In addition, the wavelength deviation emitted from the second light emitting diode 310 may be reduced by the second yellow light conversion layer 340.

As illustrated in FIGS. 17 and 20A, the blue light emitting element 400 may include the third light emitting diode 410, a third yellow light conversion layer 440, and the blue filter 430.

The third light emitting diode 410 and the third yellow light conversion layer 440 may be the same as the first light emitting diode 210 and the first yellow light conversion layer 240 illustrated in FIG. 18. Particularly, the third light emitting diode 410 may emit light having the wavelength λB1 shorter than the blue wavelength, as illustrated in FIG. 20B. In addition, the third yellow light conversion layer 440 may convert the wavelength λB1 shorter than the blue wavelength to light having the red wavelength λR and light having the green wavelength λG. As illustrated in FIG. 20C, the third yellow light conversion layer 440 may emit light having the wavelength λB1 shorter than the blue wavelength, light having the red wavelength λR, and light having the green wavelength λG.

As illustrated in FIG. 20D, the blue filter 430 may pass light having the blue wavelength λB among the incident light and may block light having the wavelength different from the blue light. Particularly, the blue filter 430 may pass light having the blue wavelength λB, and may block light having the red wavelength λR and light having the green wavelength λG.

In addition, the third light emitting diode 410 may emit light having the wavelength λB1 shorter than the blue wavelength λB, and the blue filter 430 may block light having the wavelength shorter than the blue wavelength λB, and may pass light having the wavelength longer than the blue wavelength λB.

As a result, as illustrated in FIG. 20E, the blue light emitting element 400 may emit light having the maximum intensity at the blue wavelength λB. In addition, the wavelength deviation emitted from the third light emitting diode 410 may be reduced by the blue filter 430.

Figure 21:
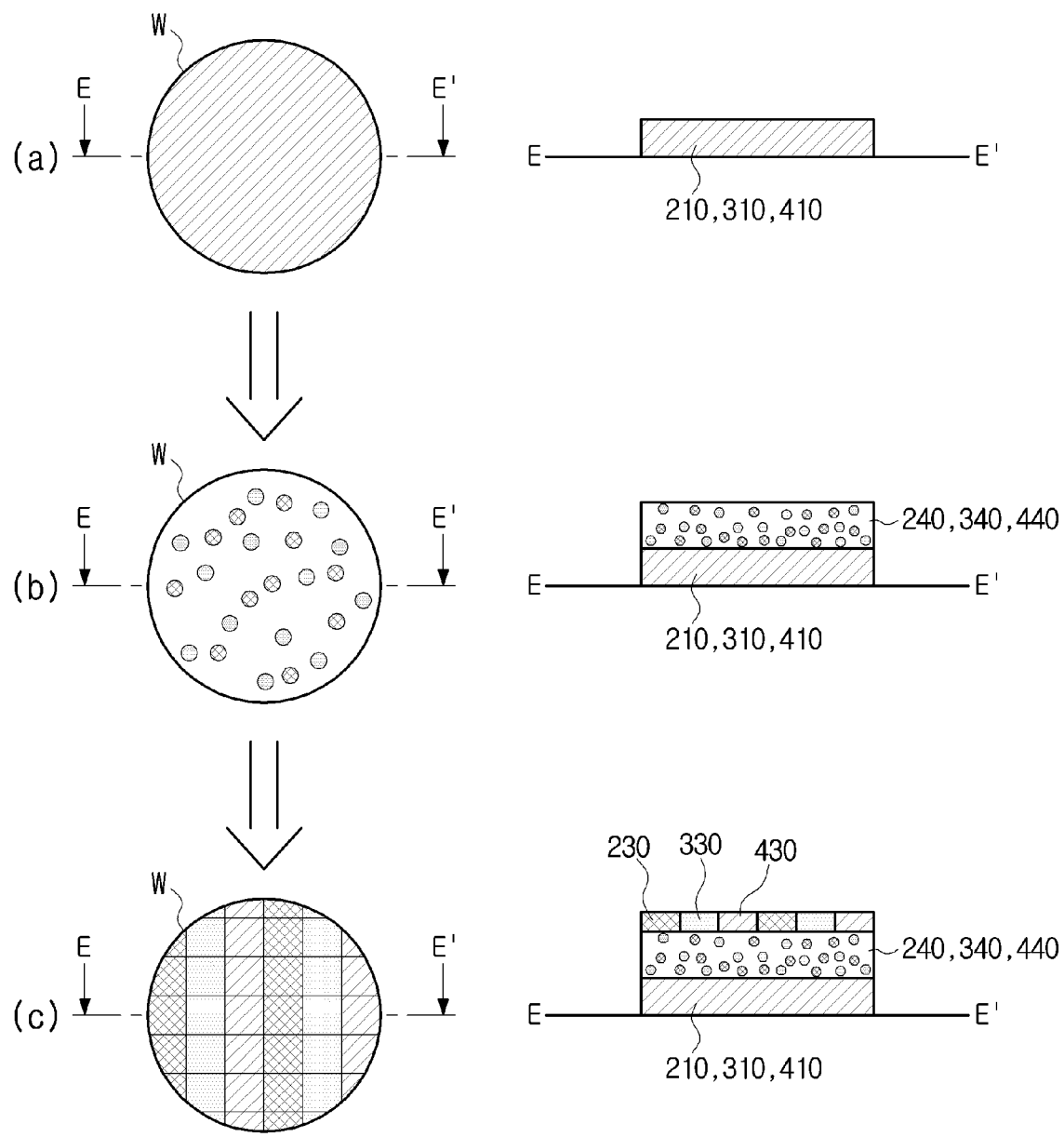
FIG. 21 is a view illustrating a process of manufacturing a red light emitting element, a green light emitting element and a blue light emitting element illustrated in FIG. 17.

FIG. 21 is a view illustrating a process of manufacturing a red light emitting element, a green light emitting element and a blue light emitting element illustrated in FIG. 17.

As illustrated in FIG. 21A, the wafer W may be provided, and the plurality of blue light emitting diodes may be formed on the wafer W. For example, the plurality of PN junctions may be formed by growing the first epitaxial layer containing the first impurity on the wafer W forming the substrate and then growing the second epitaxial layer containing the second impurity. Each of the plurality of PN junctions may be the blue light emitting diode.

Thereafter, as illustrated in FIG. 21B, the yellow light conversion layers 240, 340, and 440 may be formed on the wafer W on which the plurality of blue light emitting diodes are formed. For example, the red light conversion layer 220 may apply (or coat) the material on which the quantum dots having the diameter of approximately 7 nm, the quantum dots having the diameter of approximately 4 nm and the liquid transparent resin are mixed on the wafer W, and may be formed by curing the material in which the quantum dots and the transparent resin are mixed.

Thereafter, as illustrated in FIG. 21C, the color filters 230, 330, and 430 may be formed on the wafer W on which the yellow light conversion layers 240, 340, and 440 are formed. The color filters 230, 330, and 430 may include the red filter 230, the green filter 330, and the blue filter 430. The red filter 230, the green filter 330, and the blue filter 430 may be arranged side by side on the yellow light conversion layers 240, 340, and 440. For example, the color filters 230, 330, and 430 may apply (or coat) the liquid red pigment, the green pigment, and the blue pigment on the yellow light conversion layers 240, 340, and 440, and may be formed by curing the liquid pigments.

Figure 22:
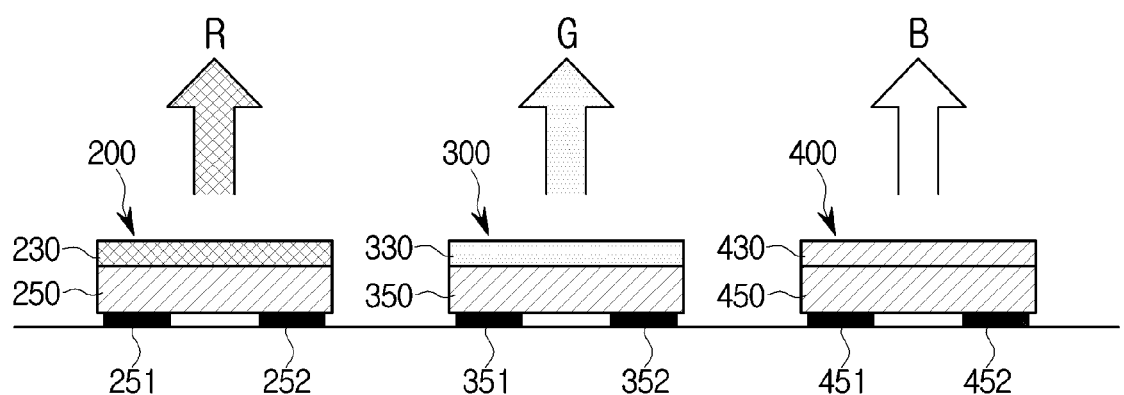
FIG. 22 is a view illustrating another example of light emitting elements included in a display apparatus according to an embodiment.
Figure 23:
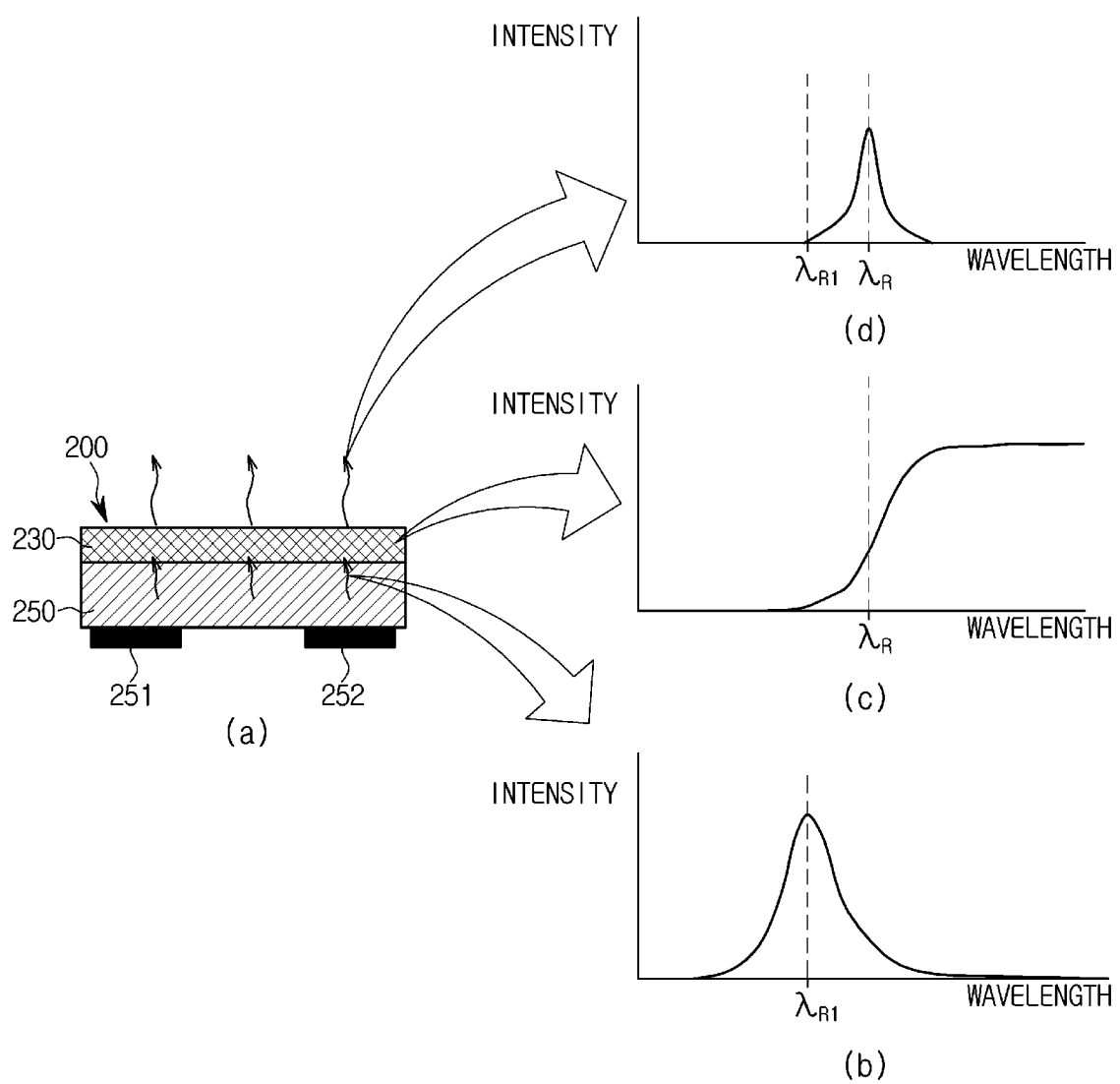
FIG. 23 is a view illustrating a structure of a red light emitting element included in the display apparatus illustrated in FIG. 22 and a spectrum of light output from the red light emitting element.
Figure 24:
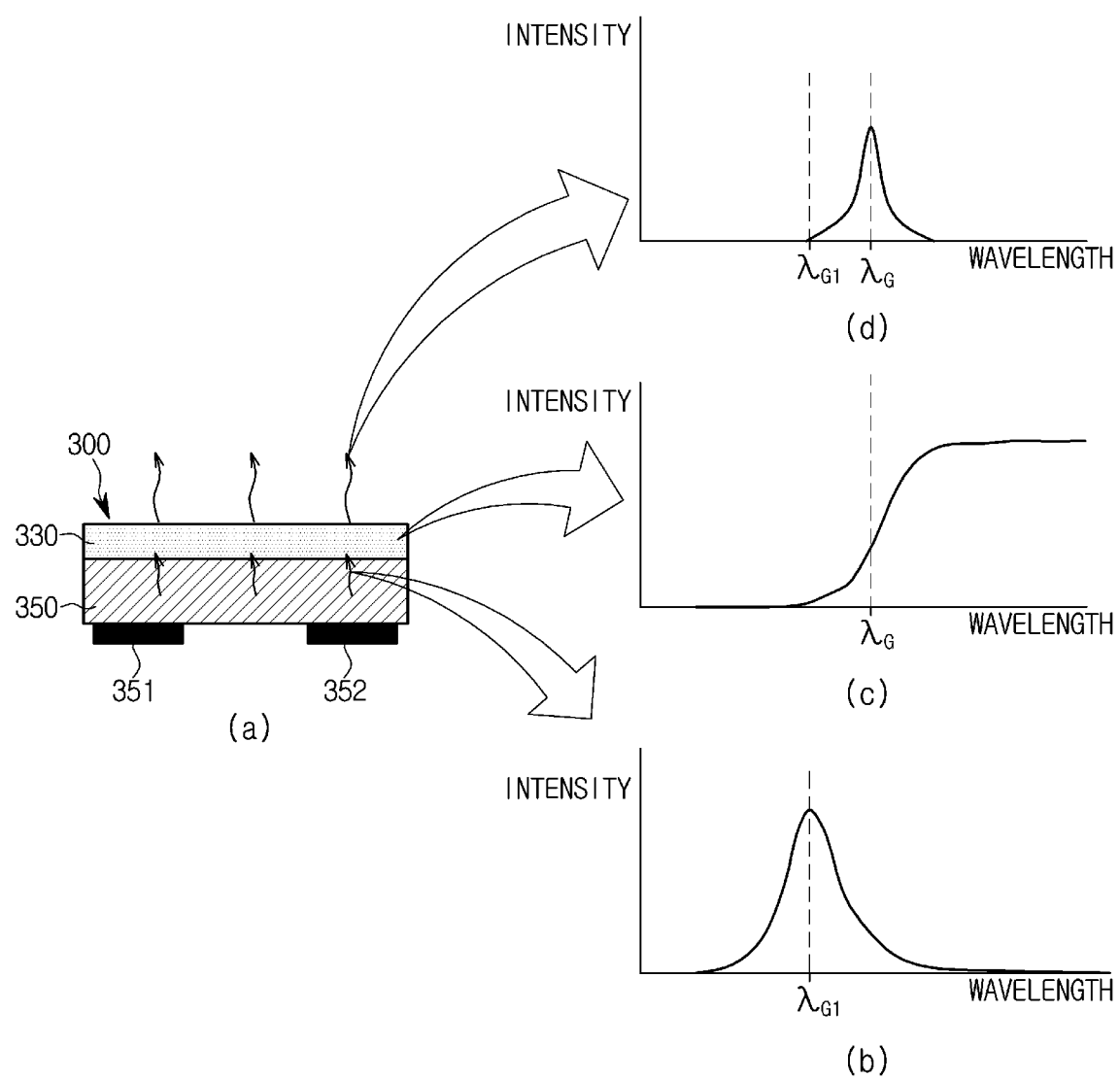
FIG. 24 is a view illustrating a structure of a green light emitting element included in the display apparatus illustrated in FIG. 22 and a spectrum of light output from the green light emitting element.
Figure 25:
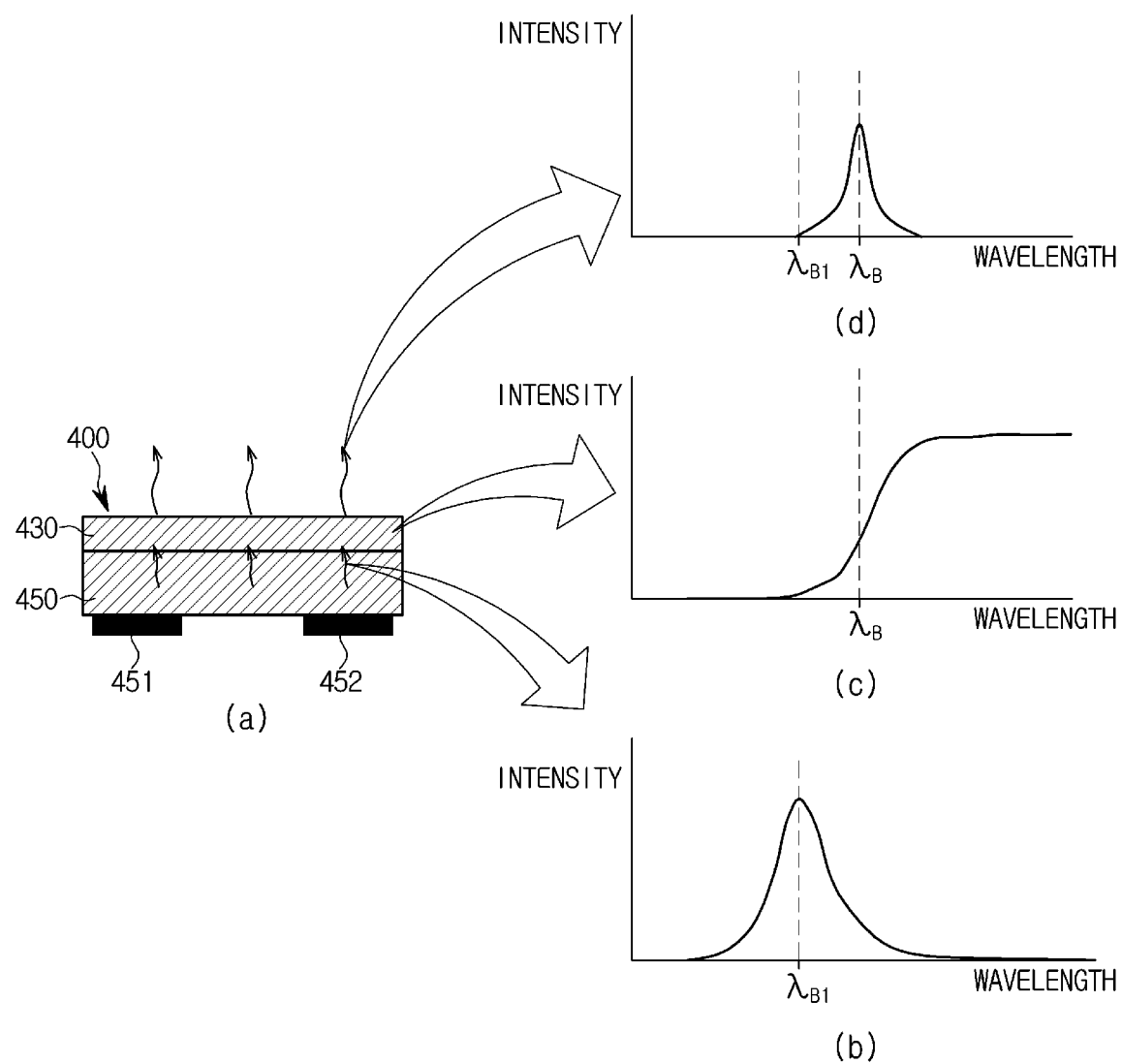
FIG. 25 is a view illustrating a structure of a blue light emitting element included in the display apparatus illustrated in FIG. 22 and a spectrum of light output from the blue light emitting element.

FIG. 22 is a view illustrating another example of light emitting elements included in a display apparatus according to an embodiment. FIG. 23 is a view illustrating a structure of a red light emitting element included in the display apparatus illustrated in FIG. 22 and a spectrum of light output from the red light emitting element. FIG. 24 is a view illustrating a structure of a green light emitting element included in the display apparatus illustrated in FIG. 22 and a spectrum of light output from the green light emitting element. FIG. 25 is a view illustrating a structure of a blue light emitting element included in the display apparatus illustrated in FIG. 22 and a spectrum of light output from the blue light emitting element.

As illustrated in FIG. 22, the display apparatus 100 may include the red light emitting element 200, the green light emitting element 300, and the blue light emitting element 400.

As illustrated in FIGS. 22 and 23A, the red light emitting element 200 may include a red light emitting diode 250 and the red filter 230.

The red light emitting diode 250 may be supplied with the driving current from the driving circuit through a cathode terminal 251 and an anode terminal 252. For example, as illustrated in FIG. 23B, the red light emitting diode 250 may emit light having the maximum intensity at a wavelength λR1 similar to the red wavelength λR and shorter than the red wavelength λR.

The red filter 230 may block light having the wavelength shorter than the red wavelength λR and pass light having the wavelength longer than the red wavelength kR. Of the light emitted from the red light emitting diode 250, the light having the wavelength longer than the red wavelength λR may pass through the red filter 230, and thus the light passing through the red filter 230 may have the maximum intensity at the red wavelength λR.

As a result, the red light emitting element 200 may emit light having the maximum intensity at the red wavelength λR, as illustrated in FIG. 23C. In addition, the wavelength deviation of the light emitted from the red light emitting diode 250 may be reduced by the red filter 230.

As illustrated in FIGS. 22 and 24A, the green light emitting element 300 may include a green light emitting diode 350 and the green filter 330.

The green light emitting diode 350 may be supplied with the driving current from the driving circuit through a cathode terminal 351 and an anode terminal 352. For example, as illustrated in FIG. 24B, the green light emitting diode 350 may emit light having the maximum intensity at the wavelength λG1 similar to the green wavelength λG and shorter than the green wavelength λG.

The green filter 330 may block light having the wavelength shorter than the green wavelength λG and pass light having the wavelength longer than the green wavelength λG. Of the light emitted from the green light emitting diode 350, the light having the wavelength longer than the green wavelength λG may pass through the green filter 330, and thus the light passing through the green filter 330 may have the maximum intensity at the green wavelength λG.

As a result, the green light emitting element 300 may emit light having the maximum intensity at the green wavelength λG, as illustrated in FIG. 24C. In addition, the wavelength deviation of the light emitted from the green light emitting diode 350 may be reduced by the green filter 330.

As illustrated in FIGS. 22 and 25A, the blue light emitting element 400 may include a blue light emitting diode 450 and the blue filter 430.

The blue light emitting diode 450 may be supplied with the driving current from the driving circuit through a cathode terminal 451 and an anode terminal 452. For example, as illustrated in FIG. 25B, the blue light emitting diode 450 may emit light having the maximum intensity at the wavelength λB1 similar to the blue wavelength λB and shorter than the blue wavelength λB.

The blue filter 430 may block light having the wavelength shorter than the blue wavelength λB and pass light having the wavelength longer than the blue wavelength λB. Of the light emitted from the blue light emitting diode 450, the light having the wavelength longer than the blue wavelength λB may pass through the blue filter 430, and thus the light passing through the blue filter 430 may have the maximum intensity at the blue wavelength λB.

As a result, the blue light emitting element 400 may emit light having the maximum intensity at the blue wavelength λB, as illustrated in FIG. 25C. In addition, the wavelength deviation of the light emitted from the blue light emitting diode 450 may be reduced by the blue filter 430.

Meanwhile, the disclosed embodiments may be implemented in the form of a recording medium storing instructions that are executable by a computer. The instructions may be stored in the form of a program code, and when executed by a processor, the instructions may generate a program module to perform operations of the disclosed embodiments. The recording medium may be implemented as a computer-readable recording medium.

The computer-readable recording medium may include all kinds of recording media storing commands that can be interpreted by a computer. For example, the computer-readable recording medium may be ROM, RAM, a magnetic tape, a magnetic disc, flash memory, an optical data storage device, etc.

Embodiments and examples of the disclosure have thus far been described with reference to the accompanying drawings. It will be obvious to those of ordinary skill in the art that the disclosure may be practiced in other forms than the embodiments as described above without changing the technical idea or essential features of the disclosure. The above embodiments are only by way of example, and should not be interpreted in a limited sense.

The invention claimed is:

1. A display apparatus comprising:
   a blue light emitting element configured to emit blue light;
   a red light emitting element configured to emit red light;
   a green light emitting element configured to emit green light;
   a driving circuit configured to supply a driving current to the blue light emitting element; and
   a compensation circuit configured to compensate a luminance of the light emitted from the blue light emitting element,
   wherein the blue light emitting element comprises:
   a first light emitting diode configured to emit light having a maximum intensity at a wavelength shorter than a blue wavelength; and
   a blue filter configured to transmit light having the blue wavelength.

2. The display apparatus according to claim 1, wherein the first light emitting diode is configured to emit light having the maximum intensity at any one of 15 nm (nanometer) to 25 nm smaller wavelength than the blue wavelength.

3. The display apparatus according to claim 1, wherein the first light emitting diode is configured to emit light having the maximum intensity at any one of 440 nm to 450 nm, and
   wherein the blue filter is configured to block light having a wavelength shorter than 465 nm.

4. The display apparatus according to claim 1, wherein the first light emitting diode is configured to emit light having the maximum intensity at any one of 440 nm to 450 nm, and
   wherein light transmittance of the blue filter is configured to decrease rapidly at 465 nm.

5. The display apparatus according to claim 1, wherein the first light emitting diode is configured to emit light having the maximum intensity at any one of 440 nm to 450 nm, and
   wherein a blocking characteristic curve of the blue filter is configured to cross a spectral curve of the first light emitting diode at 465 nm.

6. The display apparatus according to claim 1, wherein the blue light emitting element further comprises a transparent resin layer disposed between the first light emitting diode and the blue filter, the transparent resin layer being configured to transmit light emitted from the first light emitting diode.

7. The display apparatus according to claim 1, wherein the blue light emitting element further comprises a yellow quantum dot material layer disposed between the first light emitting diode and the blue filter, the yellow quantum dot material layer being configured to absorb light emitted from the first light emitting diode and emit light having the wavelength shorter than the blue wavelength, light having a red wavelength, and light having a green wavelength.

8. The display apparatus according to claim 1, wherein the compensation circuit is configured to control the driving current so that light of a predetermined luminance is emitted from the blue light emitting element.

9. The display apparatus according to claim 1, wherein the red light emitting element comprises:
   a second light emitting diode configured to emit light having a maximum intensity at the wavelength shorter than the blue wavelength; and
   a red quantum dot material layer configured to absorb light emitted from the second light emitting diode and emit light having a red wavelength.

10. The display apparatus according to claim 1, wherein the red light emitting element comprises:
    a second light emitting diode configured to emit light having a maximum intensity at the wavelength shorter than the blue wavelength;
    a yellow quantum dot material layer configured to absorb light emitted from the second light emitting diode and emit light having the wavelength shorter than the blue wavelength, light having a red wavelength, and light having a green wavelength; and
    a red filter configured to pass light having the red wavelength.

11. The display apparatus according to claim 1, wherein the red light emitting element comprises:
    a second light emitting diode configured to emit light having a maximum intensity at a wavelength shorter than a red wavelength; and
    a red filter configured to block light having the wavelength shorter than the red wavelength.

12. The display apparatus according to claim 1, wherein the green light emitting element comprises:
    a third light emitting diode configured to emit light having a maximum intensity at the wavelength shorter than the blue wavelength; and
    a green quantum dot material layer configured to absorb light emitted from the third light emitting diode and emit light having a green wavelength.

13. The display apparatus according to claim 1, wherein the green light emitting element comprises:
    a third light emitting diode configured to emit light having a maximum intensity at the wavelength shorter than the blue wavelength;
    a yellow quantum dot material layer configured to absorb light emitted from the third light emitting diode and emit light having the wavelength shorter than the blue wavelength, light having a red wavelength, and light having a green wavelength; and a green filter configured to pass light having the green wavelength.

14. The display apparatus according to claim 1, wherein the green light emitting element comprises:

a second light emitting diode configured to emit light having a maximum intensity at a wavelength shorter than a green wavelength; and a green filter configured to block light having the wavelength shorter than the green wavelength.

15. A display apparatus comprising:

a blue light emitting element configured to emit blue light;

a red light emitting element configured to emit red light; and a green light emitting element configured to emit green light, wherein the blue light emitting element comprises:

a first light emitting diode configured to emit light having a maximum intensity at a wavelength shorter than a blue wavelength; and a blue filter configured to transmit light having the blue wavelength, and wherein the blue light emitting element further comprises a yellow quantum dot material layer disposed between the first light emitting diode and the blue filter, the yellow quantum dot material being configured to absorb light emitted from the first light emitting diode and emit light having the wavelength shorter than the blue wavelength, light having a red wavelength, and light having a green wavelength.

* * * * *